United States Patent
Kusunoki

(10) Patent No.: US 6,492,676 B2
(45) Date of Patent: *Dec. 10, 2002

(54) SEMICONDUCTOR DEVICE HAVING GATE ELECTRODE IN WHICH DEPLETION LAYER CAN BE GENERATED

(75) Inventor: Shigeru Kusunoki, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/537,310

(22) Filed: Mar. 29, 2000

(65) Prior Publication Data

US 2002/0153572 A1 Oct. 24, 2002

Related U.S. Application Data

(62) Division of application No. 09/030,958, filed on Feb. 26, 1998, now Pat. No. 6,066,880.

(30) Foreign Application Priority Data

Aug. 26, 1997 (JP) ................................ 9-229735

(51) Int. Cl.$^7$ ..................... H01L 29/76; H01L 29/788
(52) U.S. Cl. ..................... 257/316; 257/314; 257/315
(58) Field of Search ............... 257/314–324, 257/295–296; 438/257–265, 3

(56) References Cited

U.S. PATENT DOCUMENTS

| 4,990,974 A | * | 2/1991 | Vinal | 257/408 |
| 5,471,081 A | * | 11/1995 | Fishbein et al. | 257/356 |
| 5,812,442 A | * | 9/1998 | Yoo | 365/145 |

FOREIGN PATENT DOCUMENTS

| EP | 0539184 A2 | * | 4/1993 |
| JP | 54-87192 | | 7/1979 |
| JP | 57-54372 | | 3/1982 |
| JP | 60-32354 | | 2/1985 |
| JP | 3-48460 | | 3/1991 |

(List continued on next page.)

OTHER PUBLICATIONS

Narain D. Arora, et al., "Modeling the Polysilicon Depletion Effect and Its Impact on Submicrometer CMOS Circuit Performance," IEEE Transactions On Electron Devices, vol. 42, No. 5, (May 1995), pp. 935–943.

(List continued on next page.)

*Primary Examiner*—Tom Thomas
*Assistant Examiner*—Cuong Quang Nguyen
(74) *Attorney, Agent, or Firm*—Oblon, Spivak, McClelland, Maier & Neustadt, P.C.

(57) ABSTRACT

A semiconductor device including a first gate electrode having a first plane provided opposite to a first semiconductor region where a channel is to be formed with a first gate insulation film interposed therebetween; a second gate insulation film including a ferroelectric and formed on a second plane of the first gate electrode which is provided opposite to the first plane; and a second gate electrode provided opposite to the first gate electrode through the second gate insulation film, wherein the second gate electrode has a second semiconductor region provided in contact with the second gate insulation film, a depletion layer is generated in the second semiconductor region when a first voltage is applied, and a width of the depletion layer is smaller than in the case where the first voltage is applied to the depletion layer disappears when a second voltage is applied, and the second voltage causes more current to flow through the channel than the first voltage.

5 Claims, 38 Drawing Sheets

FOREIGN PATENT DOCUMENTS

| | | | |
|---|---|---|---|
| JP | 3-293767 | | 12/1991 |
| JP | 5-235335 | | 9/1993 |
| JP | 6-61437 | | 3/1994 |
| JP | 7-202178 | | 8/1995 |
| JP | 407226447 A | * | 8/1995 |
| JP | 7-273212 | | 10/1995 |
| JP | 7-321220 | | 12/1995 |

OTHER PUBLICATIONS

B. Ricco, et al., "Characterization of Polysilicon–Gate Depletion in MOS Structures," IEEE Electron Device Letters, vol. 17, No. 3, (Mar. 1996), pp. 103–105.

Francis K. Chai, et al., "Effects of Scaling Thickness and Niobium Doping Level on Ferroelectric Thin Film Capacitor Memory Operation," IEEE International Electron Device Meeting 1995, pp. 123–125.

* cited by examiner

SEMICONDUCTOR DEVICE HAVING GATE ELECTRODE IN WHICH DEPLETION LAYER CAN BE GENERATED

This application is a Division of application Ser. No. 09/030,958 filed on Feb. 26, 1998, now U.S. Pat. No. 6,066,880.

BACKGROUND OF THE INVENTION

1. Field of the Invention

The present invention relates to a semiconductor device, and more particularly to a gate electrode of an insulated gate transistor and an electrode of a capacitor.

2. Description of the Background Art

In an insulated gate transistor according to the prior art, so-called scaling has been performed in which an operating supply voltage is set low from the viewpoint of hot-carrier resistance and reliability of a gate insulation film along with a finer structure of an element.

In a short channel transistor having a small channel length, a saturation current IDsat is generally proportional to a difference (VG−Vth) between a gate voltage VG and a threshold voltage Vth. For this reason, if the gate voltage VG is equal to a supply voltage VDD, the saturation current IDsat is proportional to a difference (VDD−Vth) between the supply voltage and the threshold voltage.

In order to suppress a short circuit current of a circuit and surely turn off a transistor, a current flowing between a gate and a source when the gate voltage VG is equal to or smaller than the threshold voltage, that is, a subthreshold current should be suppressed.

A current flowing when the gate voltage is 0V, that is, an OFF-state current IOFF is calculated by Equation 1, wherein a gate voltage VG necessary for increasing the subthreshold current by one digit, that is, a subthreshold coefficient is represented by S and a threshold voltage Vth is set to VG applied when a drain current ID for 1.0 μm of a gate width W is equal to 0.1 μA:

The subthreshold coefficient S is physically calculated by Equation 2:

$$IOFF = 0.1\ \mu A \times 10^{-(Vth/S)} \quad (1)$$

$$S = \frac{kT}{q} \times \log_e 10 \times \left(1 + \frac{CB + Cit}{COX}\right) \quad (2)$$

wherein k represents a Boltzmann's constant, q represents an elementary charge, e represents a base of a natural logarithm, T represents an absolute temperature, CB represents a depletion layer capacitance between a channel and a substrate, Cit represents a capacitance based on an interface state of a gate oxide film, and COX represents a capacitance of the gate oxide film.

If CB and Cit are equal to 0, S=60 mV/decade is obtained at a room temperature of 300 K. If CB and Cit are not equal to 0, S=70 to 100 mV/decade is obtained. For example, when an OFF-state current IOFF for a gate width of 1.0 μm in a general transistor is set to 0.1 pA and a subthreshold coefficient S is set to 85 mV/decade, Vth is set to 0.51V by Equation 3 when a drain voltage VD is a supply voltage VDD. This value is not varied when a standard of the OFF-state current IOFF and a value of the subthreshold coefficient S are not changed even if the supply voltage VDD is reduced.

$$Vth = S \times \log_e \frac{0.1\mu A}{0.1 pA} \quad (3)$$

Accordingly, even if the supply voltage VDD is set low when making a finer structure, the threshold voltage Vth is not subjected to the scaling because the OFF-state current IOFF is restricted. On the other hand, the saturation current IDsat is proportional to (VDD−Vth). Therefore, current driving force is reduced and an operating speed of an element is decreased in some cases when making a finer structure.

In a transistor having a low threshold voltage Vth, an impurity concentration of a channel is low after making a finer structure. For this reason, punch-through is caused so that a current which cannot be controlled by the gate voltage VG flows. Consequently, a circuit performs wrong operation.

In the case where a transistor is used for an output stage of the circuit or the like, a supply voltage VDD1 applied to the transistor is sometimes set higher than a supply voltage VDD of other circuit portions. In the same transistor, for example, a voltage of 0 V to VDD is applied as a gate voltage VG and a voltage of 0 V to VDD1 is applied as a drain voltage VD. In this case, a maximum voltage applied to a gate insulation film is VDD1 if the gate voltage VG is 0 V and the drain voltage VD is VDD1. In such a transistor, therefore, a thickness of the gate insulation film should be resistant to an electric field having an intensity obtained by VDD1/tOX.

The foregoing will further be described with reference to FIGS. 72 to 74. In FIG. 72, a P-channel MOS transistor M1 and an N-channel MOS transistor M2 form an inverter. An input voltage VIN applied to an input terminal of the inverter has a value of 0 V or 2.5 V. A voltage of 5 V is applied to a source of the transistor M1, and a ground voltage VSS (0 V) is applied to a source of the transistor M2. With such a structure, an output voltage VOUT is 5 V when the input voltage VIN is 0 V, and a maximum voltage (5 V) is applied between a drain and a gate of the transistor M2. At this time, the maximum voltage (5 V) is also applied between a drain and a gate of the transistor M1.

In FIG. 73, P-channel MOS transistors M3 and M5 and N-channel MOS transistors M4 and M6 form an OR circuit. The transistors M4 and M6 are connected in parallel. Parallel connected elements comprising the transistors M4 and M6, and the transistors M3 and M5 are connected in series. A supply voltage VDD is given to a source of the transistor M5. A connecting point of drains of the parallel connected elements and the transistor M3 acts as an output terminal. An input voltage VIN1 given to gates of the transistors M3 and M4 and an input voltage VIN2 given to gates of the transistors M5 and M6 are changed together within a range of 0 V to 2.5 V. For this reason, a maximum voltage (5 V) is applied between gates and drains of the transistors M4 and M6 if the input voltages VIN1 and VIN2 are 0 V, and the maximum voltage (5 V) is applied between the gate and source of the transistor M5 if the input voltage VIN2 is 0 V, for example.

In FIG. 74, P-channel MOS transistors M7 and M9 and N-channel MOS transistors M8 and M10 form a NAND circuit. The transistors M7 and M9 are connected in parallel. Parallel connected elements comprising the transistors M7 and M9, and the transistors M8 and M10 are connected in series. A supply voltage VDD is given to sources of the transistors M7 and M9. Drains of the transistors M7 and M9 are connected to an output terminal. A drain of the transistor M8 is also connected to the same output terminal. A ground voltage VSS (0 V) is given to a source of the transistor M10. An input voltage VIN1 given to gates of the transistors M7 and M8 and an input voltage VIN2 given to gates of the transistors M9 and M10 are changed together within a range of 0 V to 2.5 V. For this reason, a maximum voltage (5 V) is applied between the gate and drain of the transistor M8 and the maximum voltage is also applied between the gates and drains of the transistors M7 and M9 if either of the input voltages VIN1 and VIN2 is 0 V, for example.

FIG. 75 typically shows a section of a main part of the insulated gate transistor according to the prior art. In the case where the transistor shown in FIG. 75 is an N-channel MOS transistor, the reference numeral 1 denotes a P type silicon substrate having a resistivity of several Ω·cms to several tens Ω·cms and a crystallographic axis <100>, the reference numeral 2 denotes a P well formed in the vicinity of a surface of the silicon substrate 1, the reference numeral 3 denotes a channel dope region which is formed in the P well 2 and serves to control a threshold and to prevent punch-through, the reference numeral 4 denotes a gate insulation film formed on one of principal planes of the silicon substrate 1 by using a silicon oxide film as a material, the reference numeral 5 denotes a gate electrode formed on the gate insulation film 4 by using, as a material, a polycrystalline silicon film doped with phosphorus having a high concentration, the reference numeral 6 denotes a drain region which is formed on one of principal planes of the P well 2 and includes a drain region 61 having a high impurity concentration and a drain region 62 having a low impurity concentration, the reference numeral 7 denotes a source region which is formed on one of the principal planes of the P well 2 and includes a source region 71 having a high impurity concentration and a source region 72 having a low impurity concentration, the reference numeral 8 denotes a P type substrate electrode having a high impurity concentration for giving an electric potential of the silicon substrate 1 or the P well 2 from one of the principal planes of the silicon substrate 1, the reference numeral 9 denotes an isolation film for isolating the insulated gate transistor shown in the drawing from other components such as the substrate electrode 8 and the like, the reference numeral 10 denotes a region provided in the vicinity of the gate electrode 5, whose conductivity type is inverted to form a channel when a positive voltage is applied to the gate electrode 5, and the reference numeral 11 denotes a sidewall which is provided on a side of the gate electrode 5 and is usually formed of a silicon oxide film or a silicon nitride film.

FIGS. 76 and 77 are typical enlarged views showing a section of a main part of a structure of the silicon substrate 1 provided in the vicinity of the gate insulation film 4 in FIG. 75 according to examples which are different from each other. The channel dope region 3 is formed by only a P type semiconductor region 3p as shown in FIG. 76 or is formed by an N type semiconductor region 3n and the P type semiconductor region 3p as shown in FIG. 77.

When a transistor shown in FIG. 77 is turned on, a channel is formed under the semiconductor region 3n.

FIG. 78 typically shows a section of a main part of an N-channel MOS transistor which operates with a high voltage and is one of vertical type power MOS transistors according to the prior art. In FIG. 78, the reference numeral 1A denotes a silicon substrate, the reference numeral 3A denotes a channel dope region which is formed on one of principal planes of the silicon substrate 1A and serves to control a threshold and to prevent punch-through, the reference numeral 4A denotes a gate insulation film formed on sides of a plurality of trenches extending perpendicularly to the drawing by using a silicon oxide film as a material, the reference numeral 5A denotes a gate electrode provided so as to fill up the trenches on which the gate insulation film 4A is formed, the reference numeral 61A denotes a drain region formed by doping the other principal plane of the silicon substrate 1A with an N type impurity having a high concentration, the reference numeral 62A denotes a drain region doped with the N type impurity having a comparatively lower concentration than that of the drain region 61A having a high impurity concentration in contact therewith, the reference numeral 71A denotes a source region formed in contact with the gate insulation film 4A by doping one of the principal planes of the silicon substrate 1A with the N type impurity having a high concentration, the reference numeral 8A denotes a P type substrate electrode having a high impurity concentration which is provided to give an electric potential of the silicon substrate 1A or a P well 2A from one of the principal planes of the silicon substrate 1A, the reference numeral 10A denotes a region provided in the vicinity of the gate electrode 5A, whose conductivity type is inverted to form a channel when a positive voltage is applied to the gate electrode 5A, and the reference numeral 11A denotes a sidewall which is provided on both sides of the gate electrode 5A on the silicon substrate 1A and is usually formed of a silicon oxide film or a silicon nitride film.

FIG. 79 is a graph showing a relationship between a gate voltage and a source-drain current which is obtained when a source has a voltage of 0 V, an optional positive voltage is given to a drain and a substrate has a voltage of 0 V or an optional negative voltage in the MOS transistor shown in FIG. 75 or 78. In FIG. 79, a one-dotted chain line indicates a case where the gate insulation films 4 and 4A are thin, for example, have a thickness of 8 nm, and a broken line indicates a case where structures of portions other than the gate insulation films 4 and 4A are identical and only the gate insulation films 4 and 4A are thick, for example, have a thickness of 20 nm. It is apparent from FIG. 79 that a gate-source voltage for turning on/off the insulated gate transistor, that is, a threshold voltage is raised if the thickness of the gate insulation film is increased, and is lowered if the same thickness is reduced.

When the transistor is brought into an ON state and is in an OFF state, the thickness of the gate insulation film is constant. Therefore, a subthreshold coefficient S which is an inverse number of each of maximum gradients S1 and S2 of a curve in FIG. 79 physically satisfies Equation 4, and the maximum gradients S1 and S2 are not changed. In the Equation 4, k represents a Boltzmann's constant, T represents an absolute temperature, and q represents an elementary charge.

$$S > \frac{kT}{q} \times \log_e 10 \tag{4}$$

FIG. 80 shows a relationship between a gate voltage and a gate-drain capacitance CGD and a gate-source capacitance CGS, and a relationship between the gate voltage and a gate-substrate capacitance CGB in the MOS transistor in FIG. 75 or 78.

The gate capacitance will be described below. The gate capacitance includes the gate-drain capacitance CGD, the gate-source capacitance CGS and the gate-substrate capacitance CGB. In general, the gate-drain capacitance CGD is a sum of a fringing capacitance generated on a gate electrode side and an overlap capacitance of a portion in which the gate overlaps with the drain if the gate voltage VG is smaller than the threshold voltage Vth, and is equal to an oxide film capacitance COX if the gate voltage VG is greater than the threshold voltage Vth.

The gate-source capacitance CGS is a sum of the fringing capacitance and the overlap capacitance within a total gate voltage range.

The gate-substrate capacitance CGB is equal to a value obtained by subtracting an overlap capacitance COV from the oxide film capacitance COX within a range in which the channel is accumulated, that is, the gate voltage VG is smaller than a flat band voltage VFB, and is almost obtained by (COX−COV)×CB/(COX+CB) if VFB<VG<Vth and is set to 0 if VG>Vth.

It is apparent from FIG. 80 that the gate capacitance is coincident with the oxide film capacitance COX when the transistor is in a stable state apart from a transition region in which an on-off state thereof is switched.

In the insulated gate transistor according to the prior art described above, a polycrystalline silicon having a low resistivity and a high concentration is used for the gate electrode 5. In the insulated gate transistor according to the prior art, furthermore, a silicon oxide film having a small interface state-trap density is mainly used as the gate insulation film. Thus, the insulated gate transistor has had high reliability.

Japanese Patent Laid-Open Gazettes 3-293767, 57-54372 and 54-87192 have described examples in which a conductivity type of a gate electrode is different from that of a source-drain region and the gate electrode has a high concentration.

Japanese Patent Laid-Open Gazettes 7-273212 and 7-321220 have described examples in which the structures disclosed in the above-mentioned publications are applied to a transistor having a buried channel.

In addition, Japanese Patent Laid-Open Gazette 6-61437 has described an example in which a ferroelectric film is used for a gate insulation film having the structures disclosed in the above-mentioned publications.

Japanese Patent Laid-Open Gazettes 5-235335 and 7-202178 have described examples in which a material having a small bandgap is used for a gate electrode.

Japanese Patent Laid-Open Gazette 60-32354 has described an example in which a part of a gate electrode has a low resistance.

The insulated gate transistor according to the prior art has the above-mentioned structures. The subthreshold coefficient S is greater than 60 mV/decade at a room temperature during on/off. Therefore, even if the supply voltage is reduced by the scaling, the threshold voltage is not subjected to the scaling when the OFF-state current is kept constant. Consequently, the current driving force is reduced.

Conversely, if the threshold voltage is subjected to the scaling, the OFF-state current is increased. Consequently, a logical amplitude is reduced, dissipation power is increased, and a current consumed on standby, that is, a standby current is increased and a storage capability is lowered when the transistor is used for a DRAM or the like.

In a power element shown in FIG. 78, for example, a capacitance obtained in a state in which a gate is off, that is, an overlap capacitance and a gate-substrate capacitance are increased. In addition, a supply voltage is higher than a gate voltage in the power element. Therefore, an amplification factor is great, and a gate capacitance acting as a Miller capacitance is very increased. Thus, in the case where the gate capacitance is great, a switching speed is decreased so that a switching loss is increased.

Furthermore, in the case where a plurality of circuits having various supply voltages are provided on one chip, the supply voltage is sometimes set higher than the supply voltages of other circuit portions. Depending on the transistor, a voltage which is higher than voltages of the other circuit portions is applied to the gate insulation film. As a result, the gate insulation film of the transistor in an output stage should be resistant to a voltage which is higher than voltages of the transistors in the other circuit portions, for example. Therefore, a thickness of the gate insulation film should be increased. An operating speed is decreased due to a reduction in the current driving force, and an efficiency of applying a gate electric field to a channel is reduced so that punch-through is caused.

SUMMARY OF THE INVENTION

A first aspect of the present invention is directed to a semiconductor device comprising a gate electrode provided opposite to a first semiconductor region where a channel is to be formed with a gate insulation film interposed therebetween, the gate electrode including a second semiconductor region which is provided in contact with the gate insulation film, wherein a depletion layer is generated in the second semiconductor region if the channel is insulating, and a width of the depletion layer is smaller than in the case where the channel is insulating or the depletion layer disappears if the channel is conducting.

A second aspect of the present invention is directed to the semiconductor device according to the first aspect of the present invention, wherein the second semiconductor region has a conductivity type which is reverse to a conductivity type of a source region or a drain region provided in contact with the first semiconductor region.

A third aspect of the present invention is directed to the semiconductor device according to the first aspect of the present invention, wherein the gate electrode has a resistance layer having a resistance value which is lower than a resistance value of the second semiconductor region, which the resistance layer is apart from an area of the gate insulation film, under which the area the channel is to be conducting.

A fourth aspect of the present invention is directed to the semiconductor device according to the third aspect of the present invention, wherein an impurity concentration of the second semiconductor region is locally enriched at an end of the second semiconductor region which is close to the drain region.

A fifth aspect of the present invention is directed to a semiconductor device comprising a gate electrode provided opposite to a first semiconductor region where a channel is to be formed with a gate insulation film interposed therebetween, the gate electrode including a second semiconductor region which is provided in contact with the gate insulation film, wherein a depletion layer is generated in the second semiconductor region if the channel is conducting, and a width of the depletion layer is smaller than in the case where the channel is conducting or the depletion layer disappears if the channel is insulating, and the depletion layer is formed on a condition that a maximum voltage to be supplied to the semiconductor device is applied between the gate electrode and a source/drain electrode of the semiconductor device.

A sixth aspect of the present invention is directed to the semiconductor device according to the first aspect of the present invention, wherein the first semiconductor region is formed in a semiconductor layer provided on an insulator.

A seventh aspect of the present invention is directed to a semiconductor device, comprising a first gate electrode having a first plane provided opposite to a first semiconductor region where a channel is to be formed with a first gate insulation film interposed therebetween, a second gate insulation film formed on a second plane of the first gate electrode which is provided opposite to the first plane, and a second gate electrode which is provided opposite to the first gate electrode through the second gate insulation film, wherein the second gate electrode has a second semiconductor region provided in contact with the second gate insulation film, a depletion layer is generated in the second semiconductor region if a first voltage is applied, and a width of the depletion layer is smaller than in the case where the first voltage is applied or the depletion layer disappears if a second voltage is applied, and the second voltage causes a more current to flow through the channel than the first voltage.

An eighth aspect of the present invention is directed to the semiconductor device according to any of the first to seventh aspects of the present invention, wherein the gate electrode includes a ferroelectric.

A ninth aspect of the present invention is directed to a semiconductor device comprising a dielectric film having first and second principal planes, a first electrode provided on the first principal plane and formed of a semiconductor having a first conductivity type, and a second electrode provided on the second principal plane and formed of a semiconductor having a second conductivity type which is reverse to the first conductivity type, wherein the first and second electrodes have greater widths of depletion layers when a voltage making a P type semiconductor a positive potential and making an N type semiconductor a negative potential is not applied than when the voltage is applied.

A tenth aspect of the present invention is directed to the semiconductor device according to the eighth aspect of the present invention, wherein the dielectric film includes a ferroelectric.

According to the first aspect of the present invention, a virtual thickness of the gate insulation film can be varied with a change of the depletion layer formed on the gate electrode, and breakdown voltages of the channel and the gate insulation film of an insulated gate transistor can be controlled. Consequently, a characteristic of the transistor can be enhanced.

According to the second aspect of the present invention, a more current is caused to flow through the channel when the second voltage is applied to the first semiconductor region than when the first voltage is applied to the first semiconductor region. In other words, the width of the depletion layer is smaller in an ON state of the transistor than in an OFF state thereof, or is zero. Therefore, high current driving force can be obtained and a switching loss can be reduced.

According to the third aspect of the present invention, it is possible to reduce the resistance value of the gate electrode whose resistance is comparatively increased with a reduction in the impurity concentration caused by formation of the depletion layer. Thus, an operating speed can be prevented from being decreased.

According to the fourth aspect of the present invention, the portion of the gate electrode which is close to the drain region is depleted with difficulty due to existence of the resistance layer. The current driving force can be prevented from being lowered due to the depletion layer generated in the drain region when the transistor is turned on.

According to the fifth aspect of the present invention, an effective thickness of the gate insulation film is increased with a maximum voltage by the generated depletion layer so that a breakdown voltage of the gate insulation film of the transistor can be enhanced.

According to the sixth aspect of the present invention, the channel is formed on an epitaxial layer formed on the insulator. Therefore, effects of depletion of the gate electrode can be increased more than in the case where a whole substrate is formed of a semiconductor.

According to the seventh aspect of the present invention, a virtual thickness of the second gate insulation film can be varied with a change of the depletion layer formed on the second gate electrode, and breakdown voltages of the channel and the second gate insulation film of the insulated gate transistor can be controlled. Consequently, a characteristic of the transistor can be enhanced.

According to the eighth aspect of the present invention, the gate insulation film itself spontaneously polarizes by charges generated on the gate insulation film by a dielectric. Consequently, a threshold voltage can be increased when the insulated gate transistor is brought from an ON state into an OFF state, and a lower leak current can be obtained. By the spontaneous polarization of the gate insulation film, the threshold voltage can be reduced when the insulated gate transistor is brought from the OFF state into the ON state.

According to the ninth aspect of the present invention, a capacitance can be varied by the depletion layer and an effective thickness of the dielectric film can be changed. For example, in the case where the semiconductor device is used for a memory cell, a refresh interval can be increased and a capacitance of a cell which is not accessed is reduced so that a writing speed and reliability can be enhanced. The capacitance is reduced during reading. Consequently, a reading speed can be increased.

According to the tenth aspect of the present invention, a voltage applied when the depletion layer is generated and disappears in the ON and OFF states can be controlled by the charges generated on the gate insulation film by the dielectric. Consequently, more effects can be obtained by the depletion layer.

In order to solve the above-mentioned problems, it is an object of the present invention to add a function of changing a gate capacitance to a gate electrode so as to prevent a current driving capability from being lowered due to a drop in a supply voltage with scaling and to decrease a switching loss.

It is another object of the present invention to enhance chip performance by forming a depletion layer on the gate electrode to relieve an electric field of a gate insulation film when two or more kinds of supply voltages are used for one integrated circuit formed on the same chip.

It is a further object of the present invention to enhance performance of a capacitor which can change a capacitance and an effective thickness of a dielectric film to optimize characteristics of the capacitor depending on uses.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
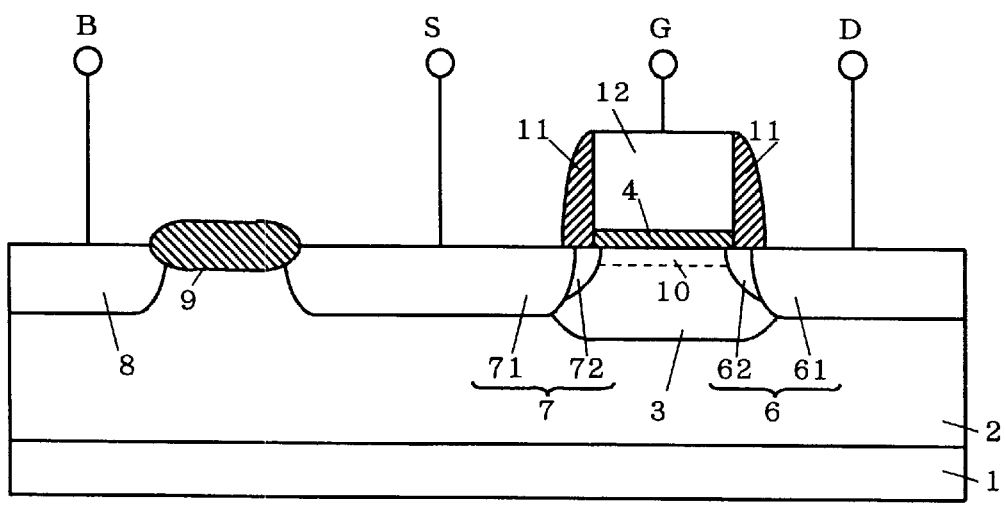
FIG. 1 is a schematic view showing an example of a section of a main part of an insulated gate transistor according to a first embodiment.

FIG. 1 is a schematic view showing a section of a main part of a structure of an insulated gate transistor according to a first embodiment of the present invention. In FIG. 1, the reference numeral 12 denotes a gate electrode formed of a semiconductor having a low impurity concentration on a gate insulation film 4, and the same reference numerals as those in FIG. 75 denote corresponding portions. The gate electrode 12 is formed of a polycrystalline silicon film doped with a dopant such as boron having a low concentration, for example. For this reason, a conductivity type of the gate electrode 12 is different from that of a source-drain region.

Figure 2:
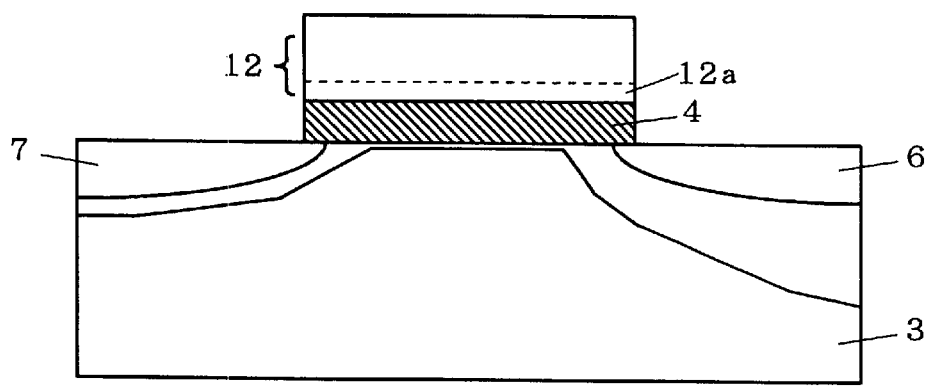
FIGS. 2 and 3 are schematic views for explaining operation of the insulated gate transistor in FIG. 1.
Figure 3:
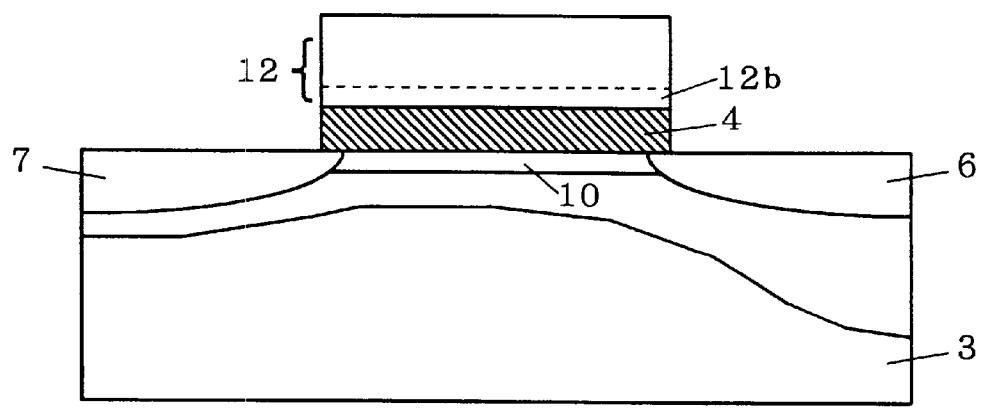

In contrast with the cited references of the prior art (Japanese Patent Laid-Open Gazettes 3-293767, 57-54372 and 54-87192) that have described examples in which a conductivity type of a gate electrode is different from that of a source-drain region and the gate electrode has a high concentration, the present invention features that a characteristic of the gate electrode 12, for example, an impurity concentration is set low in such a manner that the vicinity of the gate insulation film 4 of the gate electrode 12 is depleted when the transistor is in an OFF state and the depletion layer disappears when the transistor is in an ON state. FIGS. 2 and 3 are schematic views for explaining a status of the gate electrode in the OFF and ON states of the insulated gate transistor. In the same region, a depletion layer 12a shown in FIG. 2 is formed in the OFF state and disappears in the ON state and an accumulation layer 12b shown in FIG. 3 is formed, for example. The setting of the impurity of the gate insulation film 12 will be described below.

Figure 4:
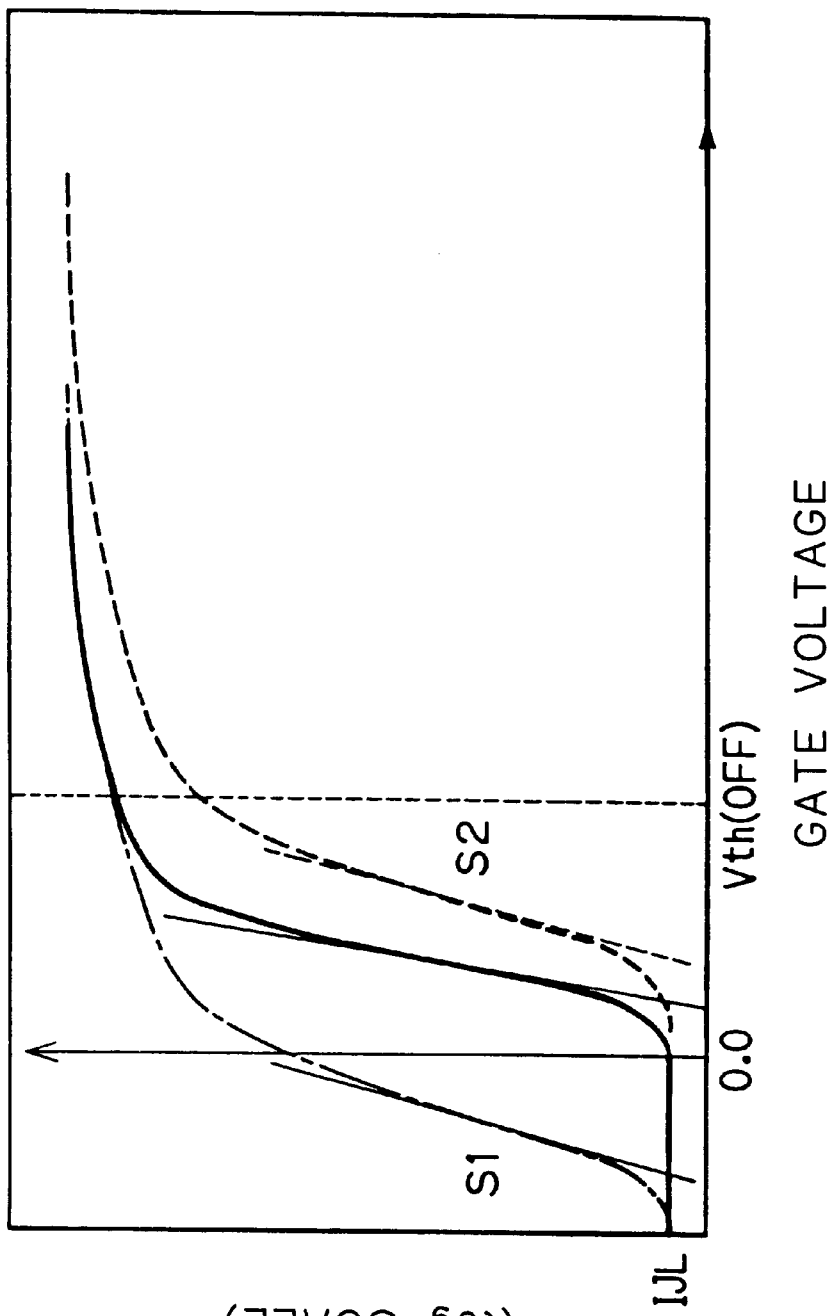
FIG. 4 is a graph showing a relationship between a gate voltage and a source-drain current in the insulated gate transistor of FIG. 1.
Figure 75:
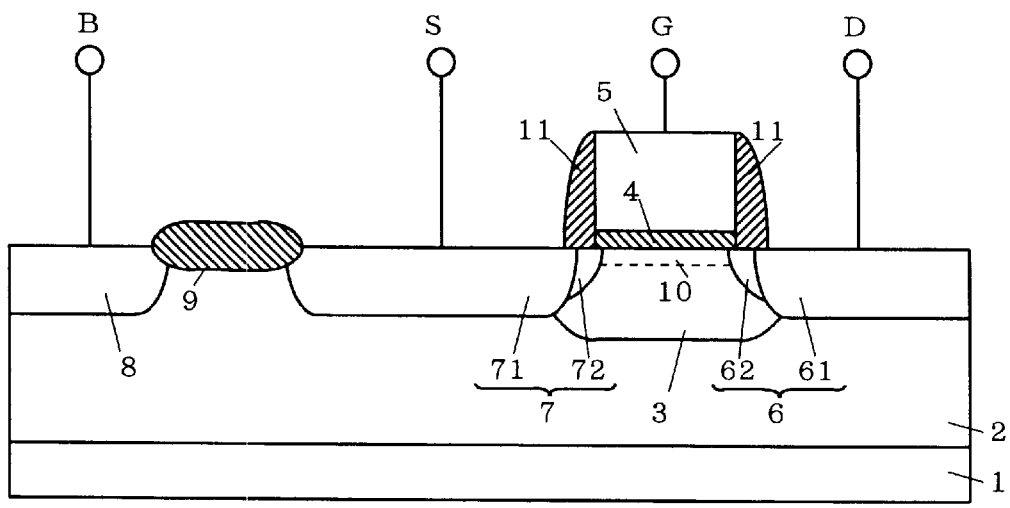
FIG. 75 is a schematic view showing an example of a section of a main part of an N-channel MOS transistor according to the prior art.
Figure 76:
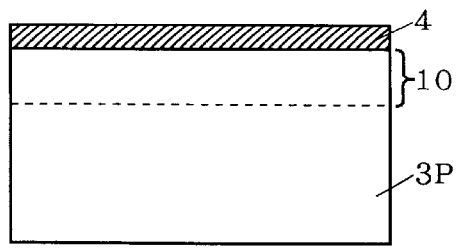
FIG. 76 is a typical enlarged view showing a portion surrounding a channel dope region of the N-channel MOS transistor according to the prior art.
Figure 77:
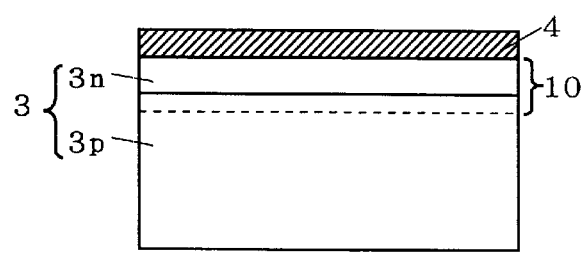
FIG. 77 is a typical enlarged view showing the portion surrounding the channel dope region of the N-channel MOS transistor according to the prior art.

FIG. 4 is a graph showing a relationship between a gate voltage and a source-drain current obtained when a source has a voltage of 0 V, an optional positive voltage is given to a drain and a substrate has a voltage of 0 V or an optional negative voltage in the MOS transistor shown in FIG. 1. In FIG. 4, a one-dotted chain line indicates a case where the gate insulation film 4 of the insulated gate transistor according to the prior art shown in FIG. 75 is thin, for example, has a thickness of 8 nm, and a broken line indicates a case where structures of portions other than the gate insulation film 4 are the same as in the case where the gate insulation film 4 has a thickness of 8 nm and only the gate insulation film 4 is thick, for example, has a thickness of 20 nm, and a solid line indicates a case where the gate insulation film 4 is thin, for example, has a thickness of 8 nm in the insulated gate transistor shown in FIG. 1. When the transistor is in the OFF state, the thickness of the gate insulation film is effectively increased by the depletion layer generated on the gate electrode 12 so that a current can be cut off with a high threshold voltage. When the transistor is in the ON state, an electric field is generated from the gate electrode 12 to a region 10 which are separated from each other by only the gate insulation film 4 without a depletion layer generated on the gate electrode 12. Consequently, an inversion layer can efficiently be formed in a channel. Thus, high current driving force can be obtained.

It is apparent from FIG. 4 that a gradient of the graph becomes sharp because a voltage for turning on the transistor is increased and a voltage for turning off the transistor is not changed, thereby reducing a subthreshold coefficient S and setting a threshold voltage lower than in the prior art.

Figure 5:
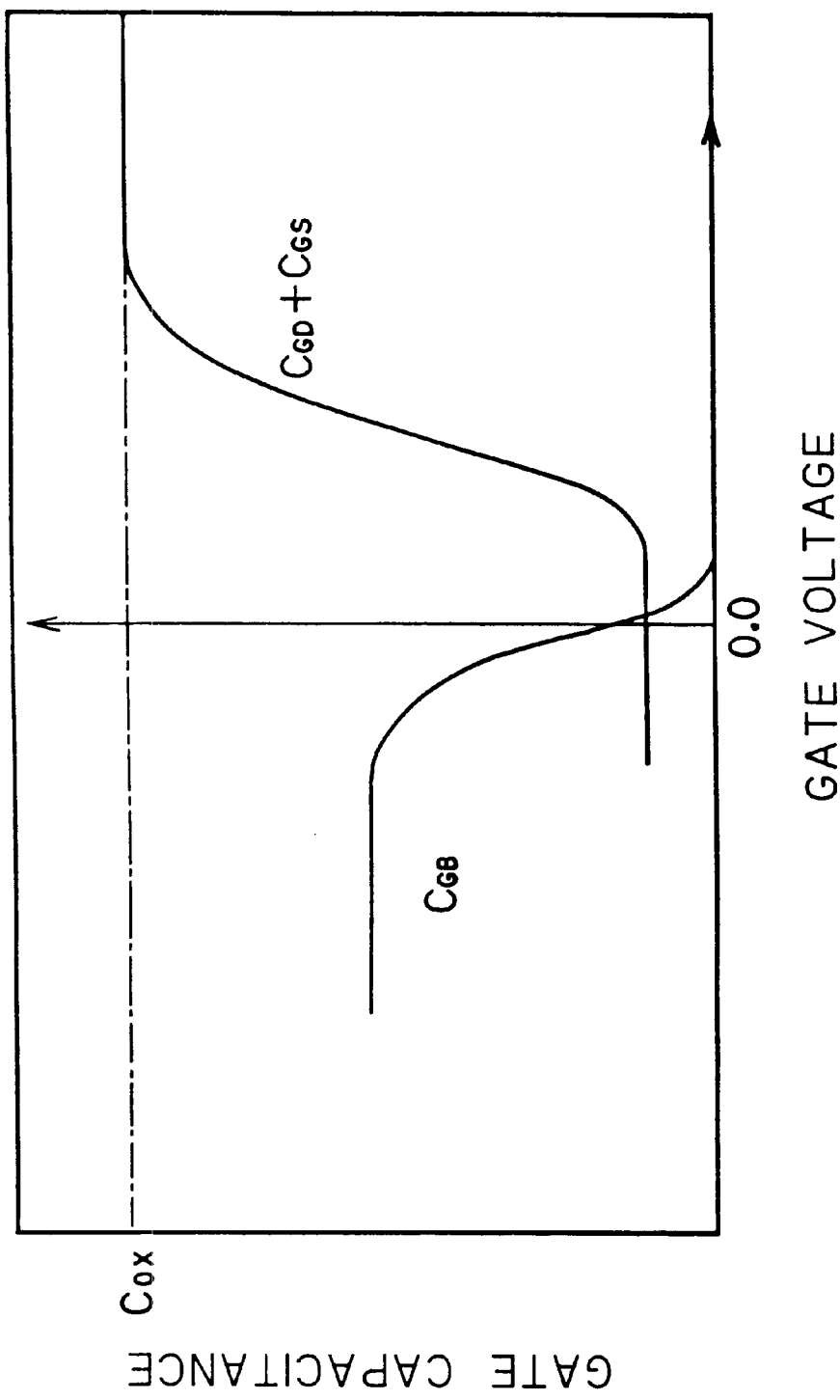
FIG. 5 is a graph showing a relationship between the gate voltage and a gate capacitance in the insulated gate transistor of FIG. 1.

FIG. 5 shows a relationship between a gate voltage and a gate-drain capacitance CGD and a gate-source capacitance CGS, and a relationship between the gate voltage and a gate-substrate capacitance CGB in the MOS transistor shown in FIG. 1. As shown in FIG. 5, it is apparent that the gate-substrate capacitance CGB is reduced and a gate capacitance is smaller than an oxide film capacitance COX when the transistor is in the OFF state. In the same manner as in the prior art, it is apparent that the gate capacitance is coincident with the oxide film capacitance COX when the transistor is in the ON state. Since the gate capacitance is small in the OFF state, a switching loss is reduced when the insulated gate transistor is turned on. Consequently, element operation can easily be performed more quickly.

When the transistor is in the ON state, an effective thickness of the gate insulation film 4 is increased by the depletion layer so that a breakdown voltage of the gate insulation film is enhanced in the ON state. Even if the thickness of the gate insulation film is not changed, the breakdown voltage of the gate insulation film can be controlled. On the other hand, in the case where insulated gate transistors having various breakdown voltages should be formed on the same substrate, deposition has conventionally been performed plural times to control the thickness of the gate insulation film during manufacture. For this reason, an impurity is mixed from a resist or the like into the gate insulation film, resulting in a reduction in reliability of the gate insulation film. Accordingly, a process of manufacturing an integrated circuit can be simplified and the reliability of the gate insulation film can be enhanced by controlling an impurity concentration of the gate electrode to form the depletion layer.

Figure 6:
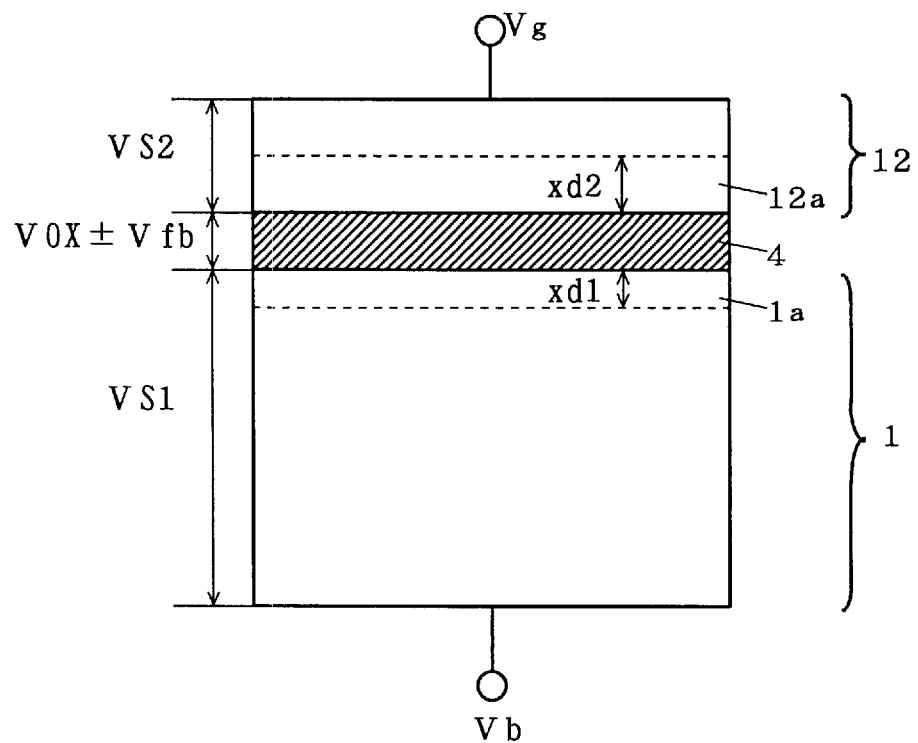
FIG. 6 is a schematic view showing a section of a MOS capacitor for explaining a method for setting a depletion layer.

By taking a MOS capacitor having a P-channel as an example, conditions for forming the depletion layer on the gate electrode 12 in an OFF state will be described below. In a silicon substrate 1 shown in FIG. 6, an impurity concentration is represented by (Na1−Nd1) by using an acceptor concentration Na1 and a donor concentration Nd1 of the silicon substrate 1, a width of a depletion layer 12a is represented by xd1, a dielectric constant is represented by ∈S1, an electron affinity is represented by χS1, a bandgap is represented by Eg1, and a difference between an intrinsic Fermi level and a quasi-Fermi level is represented by Φb1. In a gate electrode 12 shown in FIG. 6, an impurity concentration is represented by (Na2−Nd2) by using an acceptor concentration Na2 and a donor concentration Nd2 of the gate electrode 12, a width of a depletion layer 12a is represented by xd2, a dielectric constant is represented by ∈S2, an electron affinity is represented by χS2, a bandgap is represented by Eg2, and a difference between an intrinsic Fermi level and a quasi-Fermi level is represented by Φb2. In an insulation film 4 shown in FIG. 6, furthermore, a capacitance is represented by COX, a thickness is represented by tOX, an interface state density is represented by NSS, and a fixed charge distribution is represented by ρ(x).

Assuming that the gate electrode 12 is a P type semiconductor layer having a low impurity concentration, the following description will be given. First of all, a relationship between a total space charge Qsc and a charge quantity of a minority carrier Qn is obtained by Equation 5.

$$QSC = Qn + q \cdot (Na1-Nd1) \cdot xd1 + q \cdot (Nd2-Na2) \cdot xd1 \quad (5)$$

A relationship between a depletion layer width and a voltage VS1 applied to the silicon substrate 1 and a voltage VS2 applied to the gate electrode 12 is obtained by Equation 6.

$$VS1 = \frac{q \cdot (Na1 - Nd1) \cdot xd1^2}{2\varepsilon S1\varepsilon 0} \quad (6)$$

$$VS2 = \frac{q \cdot (Na2 - Nd2) \cdot xd2^2}{2\varepsilon S2\varepsilon 0}$$

When a gate voltage Vg and a back gate voltage Vb are given in consideration of a flat band voltage Vfb, voltages applied to the gate electrode 12, the gate insulation film 4 and the silicon substrate 1 have a relationship shown in Equation 7.

$$|Vg - Vb + Vfb| = VOX + VS1 + VS2 \quad (7)$$

$$VOX = \frac{-QSC}{COX}$$

By the Equations 5 to 7, Qn=0 is set in a deep depletion state so that Equation 8 is obtained.

$$|Vg - Vb + Vfb| = \quad (8)$$
$$\frac{-\{q \cdot (Nd1 - Na1) \cdot xd1 + q \cdot (Nd2 - Na2) \cdot xd2\}}{COX} +$$
$$\frac{q \cdot (Na1 - Nd1) \cdot xd1^2}{2\varepsilon S1\varepsilon 0} + \frac{q \cdot (Na2 - Nd2) \cdot xd2^2}{2\varepsilon S2\alpha\varepsilon 0}$$

In consideration of a state in which the channel is accumulated with Vg=0, that is, a state in which xd1=0 and Vg−Vb+Vfb<0 are satisfied, a depletion layer width xd2 is calculated by Equation 9.

$$xd2 = -\frac{\varepsilon S1\varepsilon 0}{COX} + \left\{\left(\frac{\varepsilon S1\varepsilon 0}{COX}\right)^2 + \frac{2\varepsilon S2\varepsilon 0}{q \cdot (Na2 - Nd2)}(Vb - Vfb - Vg)\right\}^{\frac{1}{2}} \quad (9)$$

A condition that the gate electrode 12 is depleted with the gate voltage Vg=0 is xd2>0 (Vg=9), that is, Vb−Vfb>0. A condition that the gate electrode 12 is accumulated with the gate voltage Vg=Vgx is xd2≦0 (Vg=Vgx), that is (Vb−Vfb) ≦Vgx. From these conditions, a condition for depleting and accumulating the gate electrode 12 is obtained as 0<(Vb−Vfb)≦Vgx. The flat band voltage Vfb is calculated by Equation 10.

$$Vfb = \Phi MS - \frac{1}{COX}\int_0^{tOX} \frac{1}{tOX} \rho(x)dx - \frac{qNss}{COX} \quad (10)$$

$$\Phi MS = \left(\chi S2 + \frac{Eg2}{2q} - \Phi b2\right) - \left(\chi S1 + \frac{Eg1}{2q} - \Phi b1\right)$$

If an effective gate capacitance is equal to or smaller than 90% by depletion of the gate electrode 12 with the gate voltage Vg=0, the effects of the present invention have a significant difference for errors and the like. This fact is expressed by Equation 11. The Equation 11 is transformed so that Equation 12 expressing an impurity concentration of the gate electrode 12 is obtained. An upper bound of the concentration of the gate electrode 12 ranges as expressed by the Equation 12.

$$\frac{C}{COX} = \left\{1 + \frac{2\varepsilon S2\varepsilon 0}{q \cdot (Na2 - Nd2) \cdot \varepsilon S2\varepsilon 0}(Vb - Vfb - Vg)\right\}^{\frac{1}{2}} \leq 0.9 \quad (11)$$

$$Na2 - Nd2 \leq 8.53 \cdot \frac{COX^2}{q\varepsilon S2\varepsilon 0} \cdot (Vb - Vfb) \quad (12)$$

For example, in the case where a thickness of an oxide film is represented by tOX=10 nm, a gate electrode material is represented by Si, and Vb−Vfb=0.01 V in the Equation 12, the conditions are satisfied if the impurity concentration of the gate electrode is $6.33 \times 10^{16}$ cm$^{-3}$ or less. At this time, the gate electrode 12 is depleted with a width of 6.58 nm if the impurity concentration thereof is $3 \times 10^{16}$ cm$^{-3}$, and is depleted with a width of 3.28 nm if the impurity concentration thereof is $6.33 \times 10^{16}$ $cm^{-3}$.

When the gate voltage Vg is 0 V, the depletion layer is formed on the gate electrode 12. More specifically, if the following conditions (1) to (6) and the like are satisfied, (Vb−Vfb) can easily be set to a positive value. In case of (1), if the flat band voltage Vb is positive, the condition of the flat band voltage Vfb can be relaxed. In case of (2) to (6), the flat band voltage Vfb is reduced as indicated by the Equation 10 and other conditions for reducing the flat band voltage Vfb and a condition of the back gate voltage Vb can be relaxed.

(1) In the case where a P type silicon substrate is used, the back gate voltage Vb is set to a positive voltage (which is equal to or smaller than ΦS). ΦS represents a threshold voltage of a diode formed between a source and a channel dope region. (2) The electron affinity χS2 of a gate electrode material is set smaller than χS1 of a channel material (silicon substrate). (3) A bandgap Eg2 of the gate electrode material is set smaller than a bandgap Eg1 of the channel material. (4) A difference Φb2 between an intrinsic Fermi level and a quasi-Fermi level of the gate electrode material is set greater than a difference Φb1 between an intrinsic Fermi level and a quasi-Fermi level of the channel material. In other words, a gate electrode having an impurity concentration which is higher than that of a channel is used. (5) A positive interface state density NSS is generated on an interface between the gate insulation film 4 and the gate electrode 12. (6) A positive fixed charge is introduced into the gate insulation film 4.

By using germanium as the gate electrode material, for example, a condition of −Vbf=0.28 V can be obtained from Table 1 even if the difference Φb2 between the intrinsic Fermi level and the quasi-Fermi level of the gate electrode material is equal. An alloy of silicon and germanium has a value between silicon and germanium simple substances. Therefore, a condition of 0<−Vbf<0.28 V can be obtained. The conditions of (1) to (6) described above are reversed if the gate electrode material has an N type.

TABLE 1

| Material | Electron affinity $q \chi S$ | Bandgap Eg | $q \chi S + Eg/2$ |
| --- | --- | --- | --- |
| Ge | 4.0 | 0.66 | 4.33 |
| Si | 4.05 | 1.12 | 4.61 |
| GaAs | 4.07 | 1.424 | 4.782 |

While various conditions have been obtained on a condition that the depletion is caused with a gate voltage Vg of 0 V in the description of the first embodiment, a value of the gate voltage Vg for the depletion may be set to a value other than 0 V if a signal amplitude does not include 0 V or includes a negative voltage, for example. If the depletion layer width is changed in this case, the same effects as those in the first embodiment can be obtained.

Consequently, the depletion layer does not need to completely disappear within a range of the gate voltage Vg. If the depletion layer width is changed, the same effects as those in the first embodiment can be obtained.

Second Embodiment

Figure 7:
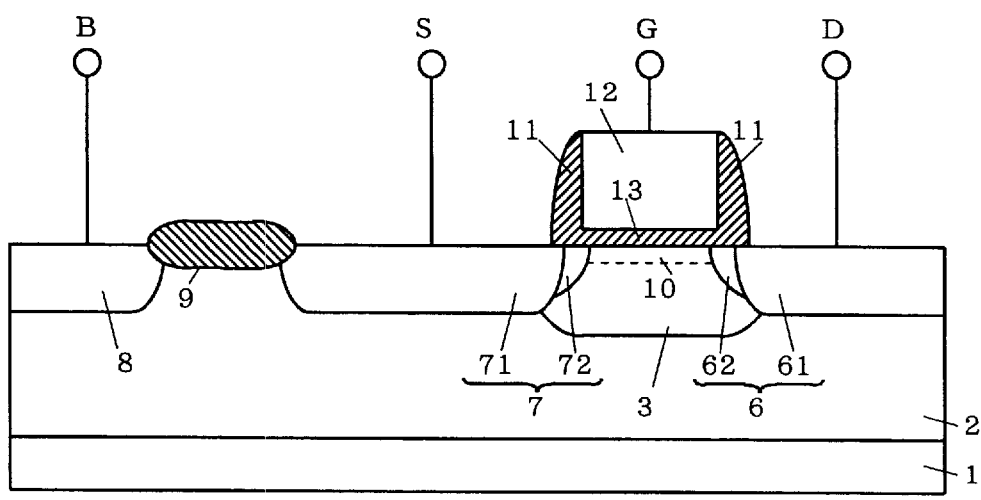
FIG. 7 is a schematic view showing an example of a section of a main part of an insulated gate transistor according to a second embodiment.

FIG. 7 is a schematic view showing a section of a main part of a structure of an N-channel insulated gate transistor according to a second embodiment of the present invention. In FIG. 7, the reference numeral 13 denotes a gate insulation film which has generated a positive interface state density on an interface with a gate electrode 12, and the same reference numerals as those in FIG. 1 denote corresponding portions.

While an interface with a silicon substrate 1 may generate the interface state density, the interface with the gate electrode 12 is preferable in consideration of transistor characteristics such as electron mobility and the like.

In order to obtain effects of the second embodiment, an interface state density to be generated in a P-channel insulated gate transistor is negative.

The insulated gate transistor according to the second embodiment has the same effects as those in the first embodiment. In addition, for example, the gate electrode 12 can easily be depleted and an impurity concentration of a channel dope region can be set comparatively high. That is to say, other conditions for the depletion can be relaxed.

Third Embodiment

Figure 8:
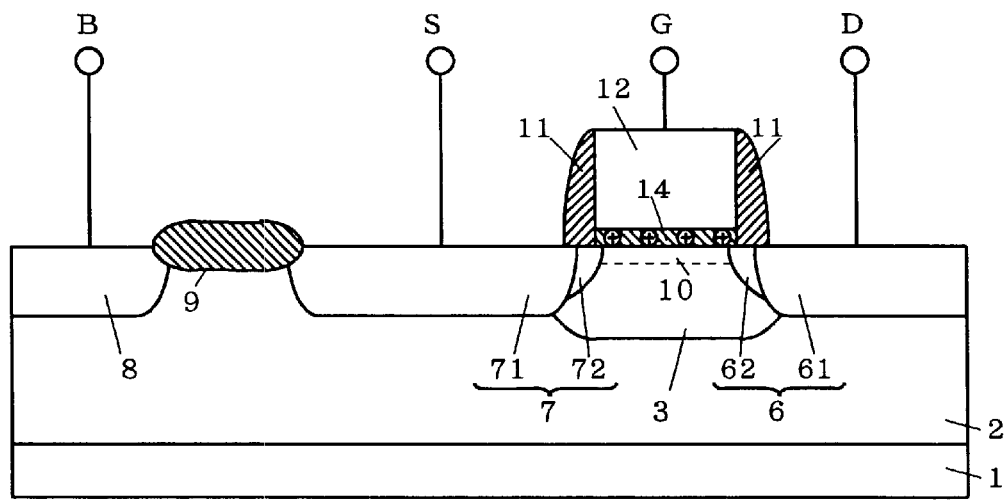
FIG. 8 is a schematic view showing an example of a section of a main part of an insulated gate transistor according to a third embodiment.

FIG. 8 is a schematic view showing a section of a main part of a structure of an insulated gate transistor according to a third embodiment of the present invention. In FIG. 8, the reference numeral 14 denotes a gate insulation film into which a positive fixed charge is introduced, and the same reference numerals as those in FIG. 1 denote corresponding portions.

The insulated gate transistor according to the third embodiment has the same effects as those in the first embodiment. In addition, for example, a gate electrode 12 can easily be depleted and an impurity concentration of a channel dope region can be set comparatively high. That is to say, other conditions for depletion can be relaxed.

Fourth Embodiment

Figure 9:
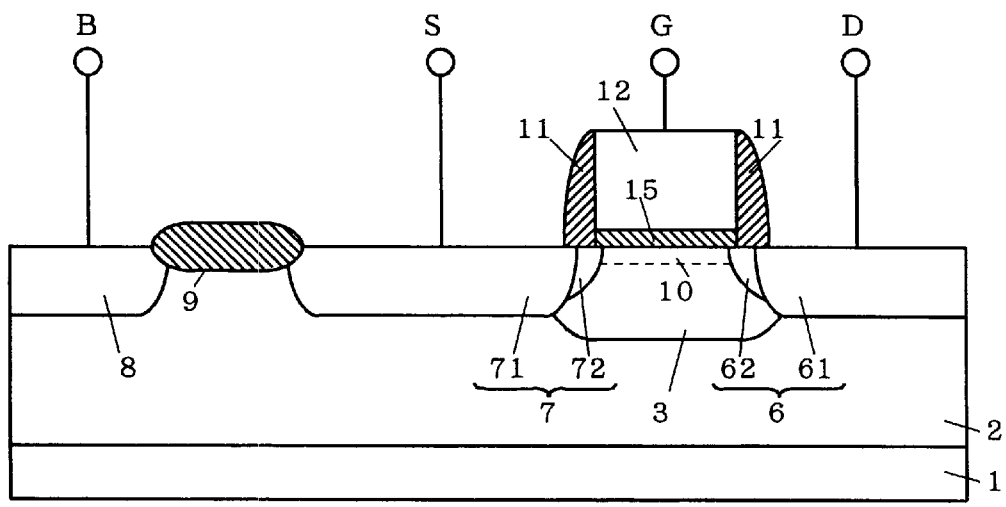
FIG. 9 is a schematic view showing an example of a section of a main part of an insulated gate transistor according to a fourth embodiment.
Figure 10:
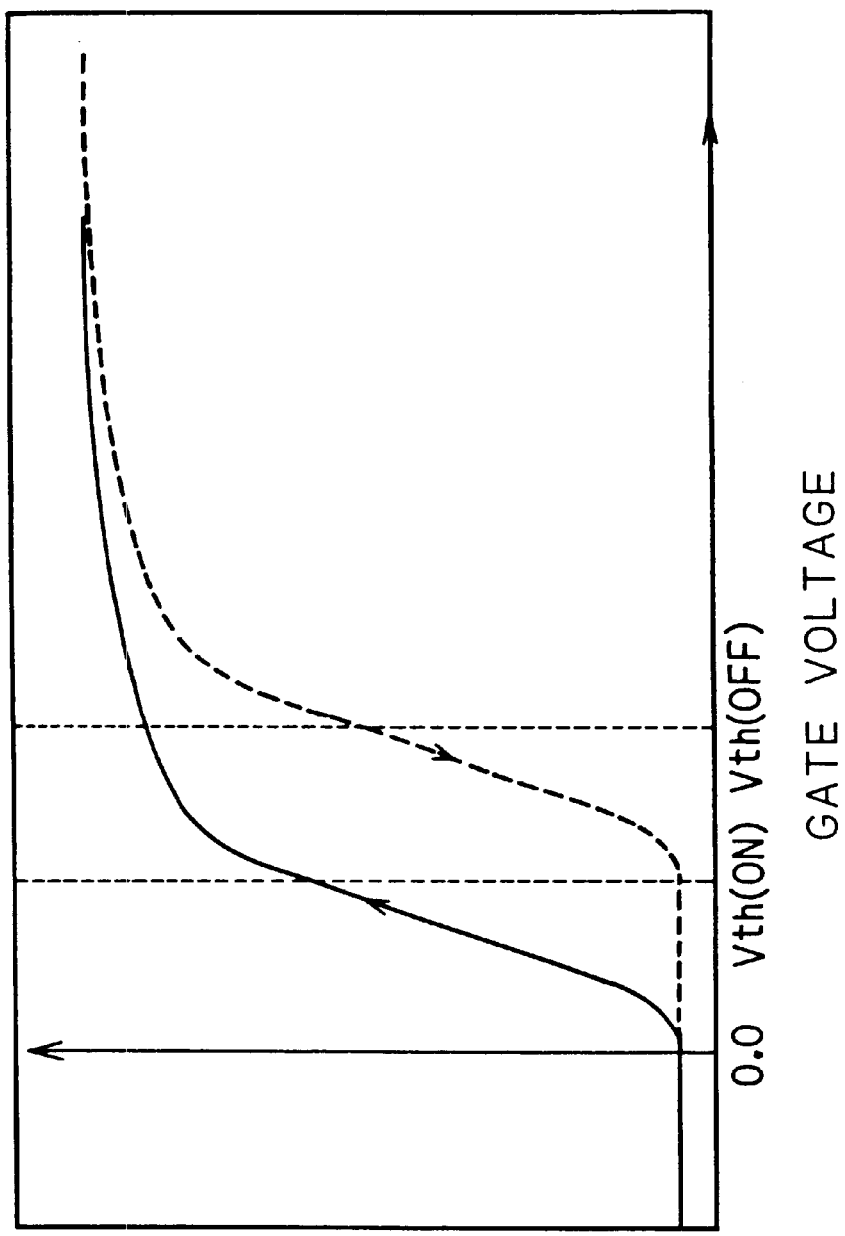
FIG. 10 is a graph showing a relationship between a gate voltage and a source-drain current according to the fourth embodiment.

FIG. 9 is a schematic view showing a section of a main part of a structure of an insulated gate transistor according to a fourth embodiment of the present invention. In FIG. 9, the reference numeral 15 denotes a gate insulation film formed of a ferroelectric, and the same reference numerals as those in FIG. 1 denote corresponding portions. FIG. 10 is a graph showing a relationship between a gate voltage and a gate-source-drain current obtained when a ferroelectric film is used for the gate insulation film.

Figure 11:
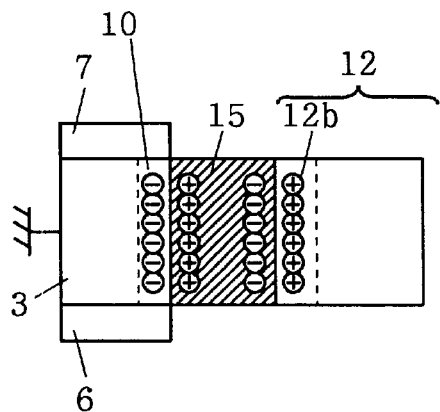
FIGS. 11 to 14 are conceptual views for explaining operation of the insulated gate transistor shown in FIG. 10.
Figure 12:
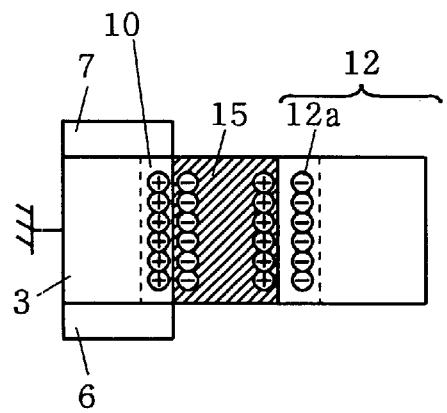

FIGS. 11 and 12 are schematic views showing operation of the insulated gate transistor in this case. In FIGS. 11 and 12, portions of the structure in FIG. 9 which are not necessary for description, for example, a sidewall 11 and the like are omitted. FIG. 11 shows a state in which a supply voltage VDD is applied to a gate electrode 12 formed of a P type semiconductor. The gate insulation film 15 is formed of the ferroelectric. Therefore, a positive charge is generated by spontaneous polarization on a side close to the gate insulation film 12. This charge acts so as not to generate a depletion layer on the gate electrode 12 but to generate an accumulation layer 12b thereon. For this reason, the transistor has a high threshold voltage when it is brought from an ON state into an OFF state, and has a low subthreshold leak current in the OFF state as shown in FIG. 10.

When a ground voltage VSS is applied to the gate electrode 12, a positive charge is generated by spontaneous polarization on a side of the gate insulation film 15 which is close to the gate electrode 12 as shown in FIG. 12. The positive charge acts in the same manner as the fixed charge according to the third embodiment. As compared with the prior art, therefore, higher current driving force can be obtained with a lower threshold voltage when the transistor is brought from the OFF state into the ON state in the same manner as in the first embodiment. Furthermore, the gate electrode 12 can easily be depleted, and an impurity concentration of a channel dope region can easily be set comparatively high.

Furthermore, the gate insulation film 15 is formed of the ferroelectric. Therefore, a threshold voltage can be increased by the spontaneous polarization of the gate insulation film 15 itself when the insulated gate transistor is brought from the ON state into the OFF state, and a lower leak current can be obtained. In addition, the threshold voltage can be reduced by the spontaneous polarization of the gate insulation film 15 when the insulated gate transistor is brought from the OFF state into the ON state.

Figure 13:
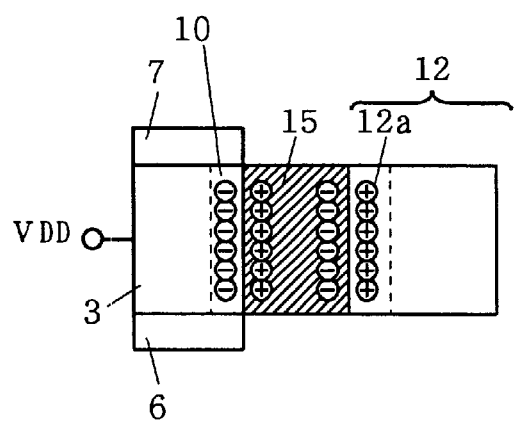
Figure 14:
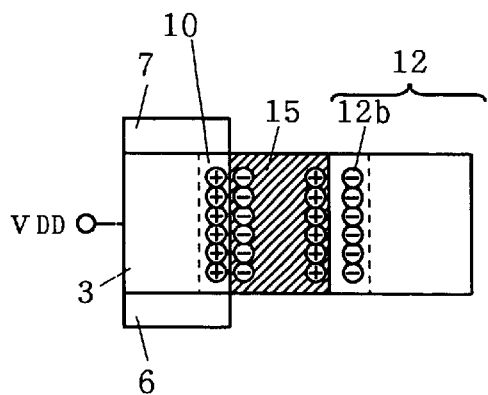

The above-mentioned effects can also be obtained in a P-channel insulated gate transistor. FIGS. 13 and 14 are views corresponding to FIGS. 11 and 12, respectively. FIG. 13 shows a state in which a supply voltage VDD is applied to a gate electrode 12 formed of an N type semiconductor and a channel dope region 3. In this case, a negative charge is generated on a side of a gate insulation film 15 which is close to the gate electrode 12 under the influence that the supply voltage VDD is applied to the gate electrode 12. FIG. 14 shows a state in which a ground voltage VSS is applied to the gate electrode 12 and the supply voltage VDD is applied to the channel dope region 3. In this case, a positive charge is generated on the side of the gate insulation film 15 which is close to the gate electrode 12 under the influence that the ground voltage VSS is applied to the gate electrode 12. The gate electrode 12 has a conductivity type of N. Contrary to a case where the gate electrode 12 has a conductivity type of P, therefore, a depletion layer 12a is formed in the state shown in FIG. 13.

Figure 15A:
FIGS. 15A and 15B are schematic views showing an example of a section of a gate insulation film according to the fourth embodiment.
Figure 15B:
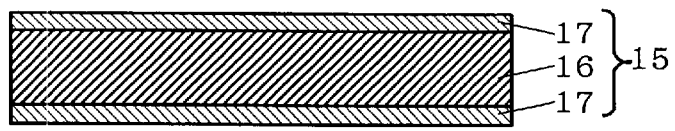

The gate insulation film 15 is not always formed of only a ferroelectric material. A gate insulation film shown in FIGS. 15A and 15B is mainly formed of the ferroelectric material. However, a case where the gate insulation film is mainly formed of the ferroelectric material includes a case where a thin layer 17 is formed of platinum, gold silicide or the like which is not very important to the function of the gate insulation film 15 according to the present invention but is used to compensate for mechanical strength thereof or the like as shown in FIG. 15B as well as a case where the gate insulation film is formed of only a ferroelectric material 16 as shown in FIG. 15A. While the layer 17 formed of platinum, gold silicide or the like is provided to enhance adhesion, it is so thin that operation shown in FIGS. 11 to 14 is not impeded.

Figure 16A:
FIGS. 16A and 16B are schematic views showing another example of the section of the gate insulation film according to the fourth embodiment.
Figure 16B:
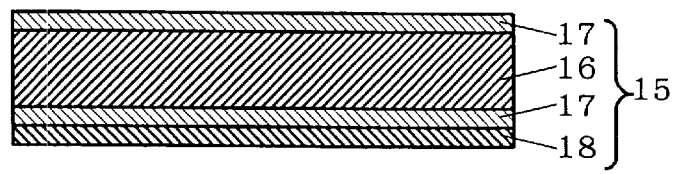
Figure 17A:
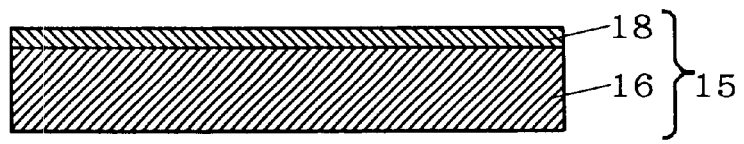
FIGS. 17A and 17B are schematic views showing yet another example of the section of the gate insulation film according to the fourth embodiment.
Figure 17B:
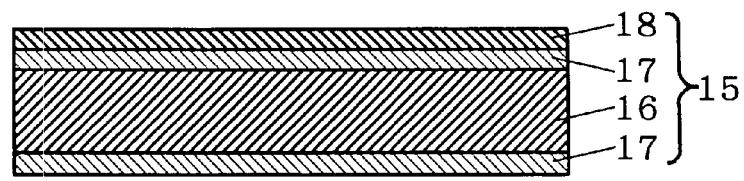
Figure 18A:
FIGS. 18A and 18B are schematic views showing a further example of the section of the gate insulation film according to the fourth embodiment.
Figure 18B:
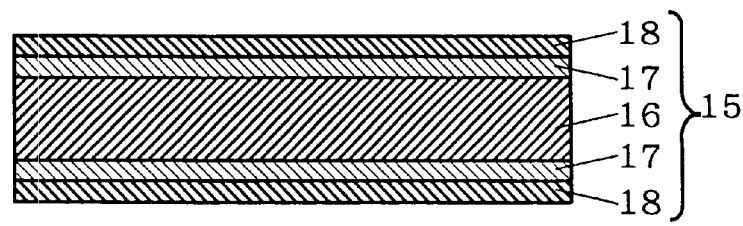

FIGS. 16A and 16B to FIGS. 18A and 18B illustrate the gate insulation film 15 formed by a combination of a ferroelectric film and an insulation film. FIGS. 16A and 16B show a case where a ferroelectric film 16 is formed on an insulation film 18 provided on a silicon substrate, FIGS. 17A and 17B show a case where the insulation film 18 is formed on the ferroelectric film 16 provided on the silicon substrate, and FIGS. 18A and 18B show a case where the ferroelectric film 16 is interposed between the insulation films 18. FIGS. 16B, 17B and 18B show cases where the thin film 17 formed of platinum or the like is used to enhance adhesion of the insulation film 18 to the ferroelectric film 16.

Figure 19:
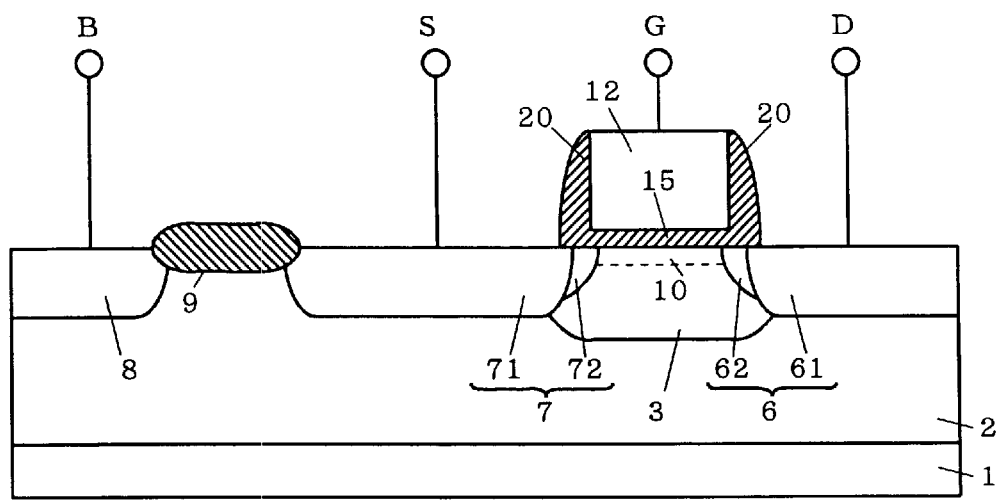
FIG. 19 is a schematic view showing another example of the section of the main part of the insulated gate transistor according to the fourth embodiment.
Figure 20:
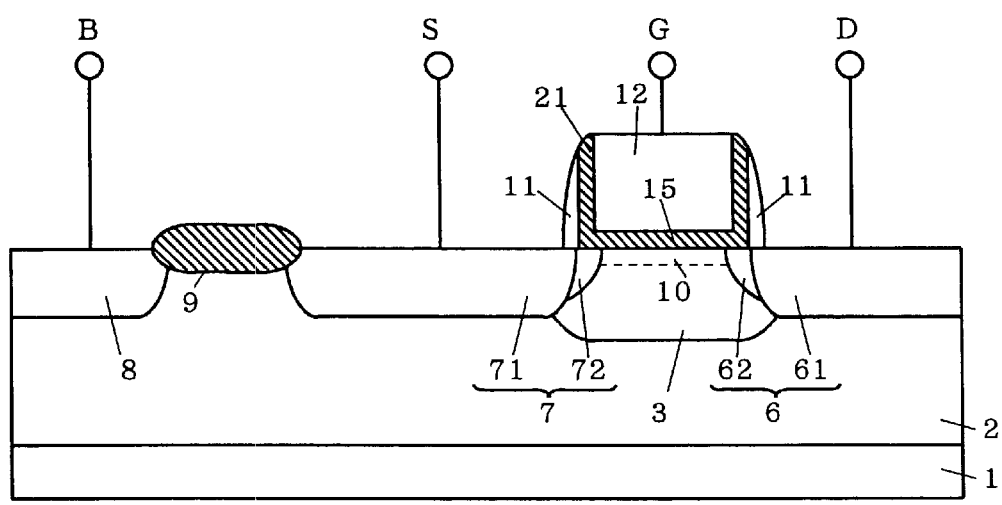
FIG. 20 is a schematic view showing yet another example of the section of the main part of the insulated gate transistor according to the fourth embodiment.
Figure 21:
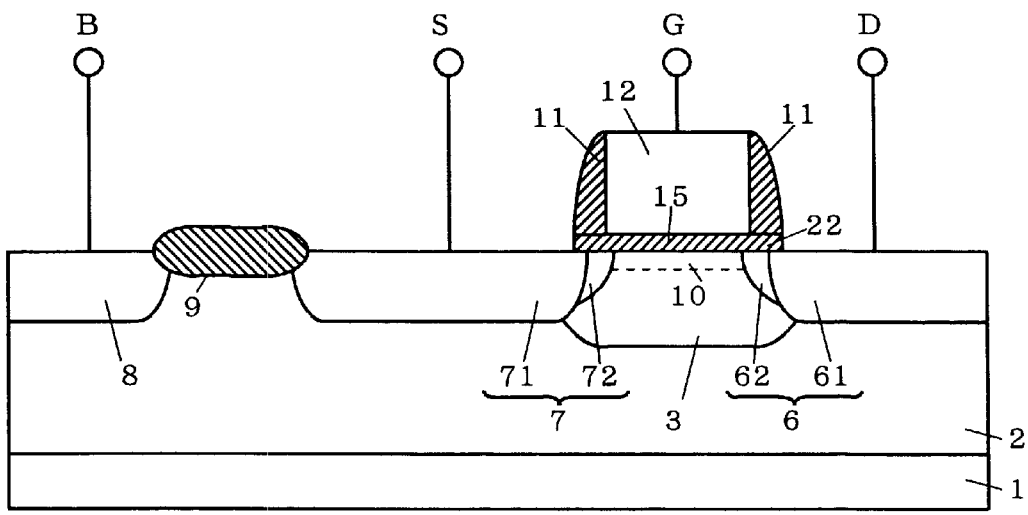
FIG. 21 is a schematic view showing a further example of the section of the main part of the insulated gate transistor according to the fourth embodiment.

In the case where a sidewall 20 formed of a ferroelectric is used as shown in FIG. 19, a layer 21 formed of a ferroelectric is provided along an internal wall of a sidewall 11 as shown in FIG. 20 or a ferroelectric film is formed up to a region 22 provided under the sidewall 11 as shown in FIG. 21, it is possible to enhance effects that higher current driving force can be obtained with a lower threshold voltage in an ON state and a lower subthreshold leak current can be obtained with a higher threshold voltage in an OFF state as compared with the above-mentioned structure.

Fifth Embodiment

In each of the insulated gate transistors according to the first to fourth embodiments, the conductivity type of the gate electrode is different from that of the source-drain region. Even if the conductivity type of the gate electrode is the same as that of the source-drain region, a depletion layer can easily be formed on the gate electrode by using a ferroelectric for a gate insulation film and properly setting an impurity concentration thereof.

Figure 22:
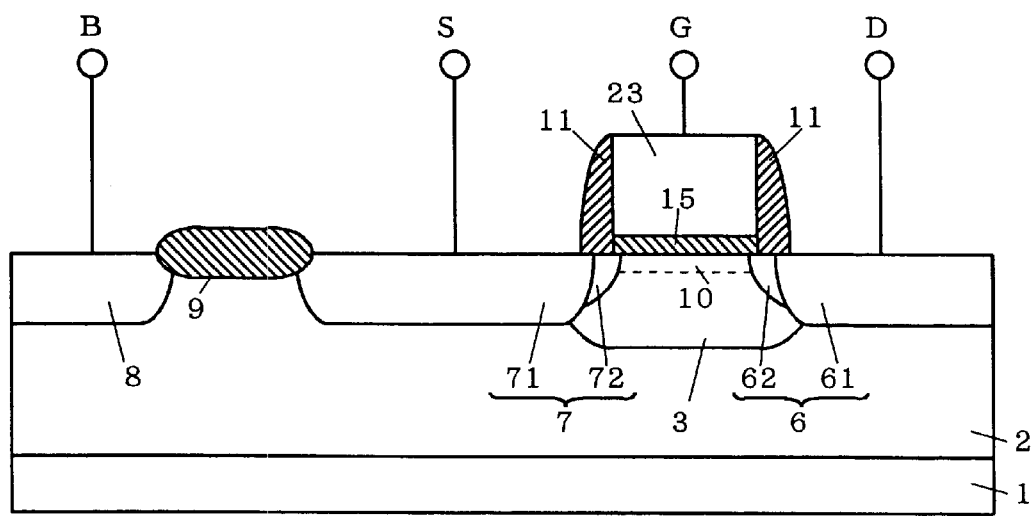
FIG. 22 is a schematic view showing an example of a section of a main part of an insulated gate transistor according to a fifth embodiment.

FIG. 22 is a schematic view showing a section of a main part of a structure of an insulated gate transistor according to a fifth embodiment of the present invention. In FIG. 22, the reference numeral 23 denotes a gate electrode formed of a semiconductor having a conductivity type which is different from that of each of a source region 7 and a drain region 6, and the same reference numerals as those in FIG. 9 denote corresponding portions.

Figure 23:
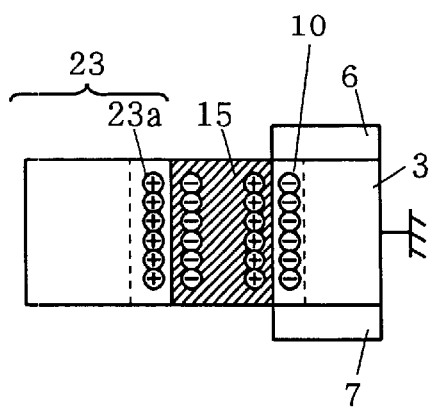
FIGS. 23 to 26 are schematic views for explaining operation of the insulated gate transistor shown in FIG. 21.
Figure 24:
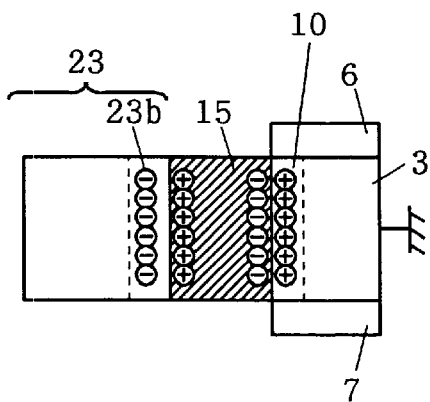

If the insulated gate transistor shown in FIG. 22 has an N-channel, the gate electrode 23 has a conductivity type of N. The operation to be performed in this case will be described with reference to FIGS. 23 and 24. In FIGS. 23 and 24, portions of the structure shown in FIG. 22 which are not necessary for description, for example, a sidewall 11 and the like are omitted. FIG. 23 shows a state in which a supply voltage VDD is applied to the gate electrode 23. A ground voltage VSS is applied to a channel dope region 3, and a gate insulation film 15 generates a negative charge by spontaneous polarization on a side close to the gate electrode 23. Under this influence, a depletion layer 23a is formed in a region of the gate electrode 23 which is provided in contact with the gate insulation film 15.

When the ground voltage VSS is applied to the gate electrode 23, the depletion layer 23a disappears and an accumulation layer 23b is generated by spontaneous polarization of the gate insulation film 15 in a region of the gate electrode 23 which is provided in contact with the gate insulation film 15 as shown in FIG. 24.

In addition to the same effects as those in the first embodiment, the insulated gate transistor according to the fifth embodiment has effects that a threshold voltage can be increased and a lower leak current can be obtained during a change from an ON state to an OFF state by the charges generated due to the spontaneous polarization of the ferroelectric.

Furthermore, the transistor according to the fifth embodiment can reduce a threshold when it is brought from the OFF state into the ON state. Therefore, current driving force can be increased still more.

Figure 25:
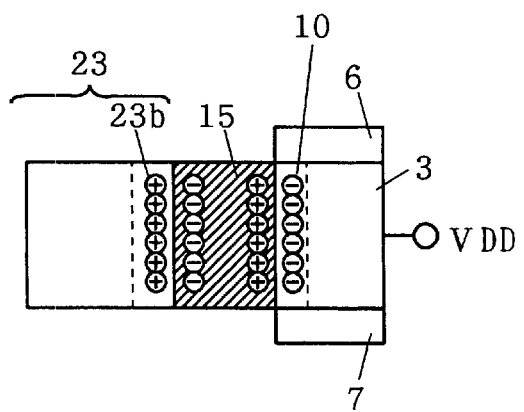
Figure 26:
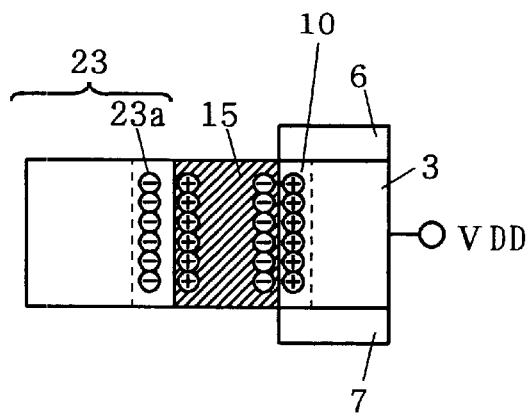

FIGS. 25 and 26 are schematic views for explaining operation of a P-channel insulated gate transistor. In the P-channel insulated gate transistor, a gate electrode 23 has a conductivity type of P and a supply voltage VDD is applied to a channel dope region 3. When the supply voltage VDD is applied to the gate electrode 23, a negative charge is generated on a side of the gate insulation film 15 which is close to the gate electrode 23 and an accumulation layer 23b is generated in a region of the gate electrode 23 which is provided in contact with the gate insulation film 15 as shown in FIG. 25. When a ground voltage VSS is applied to the gate electrode 23, a positive charge is generated on the side of the gate insulation film 15 which is close to the gate electrode 23 and a depletion layer 23a is generated in the region of the gate electrode 23 which is provided in contact with the gate insulation film 15 as shown in FIG. 26. When the transistor is in the ON state, the same effects as those in an N-channel MOS transistor can be obtained.

Figure 27:
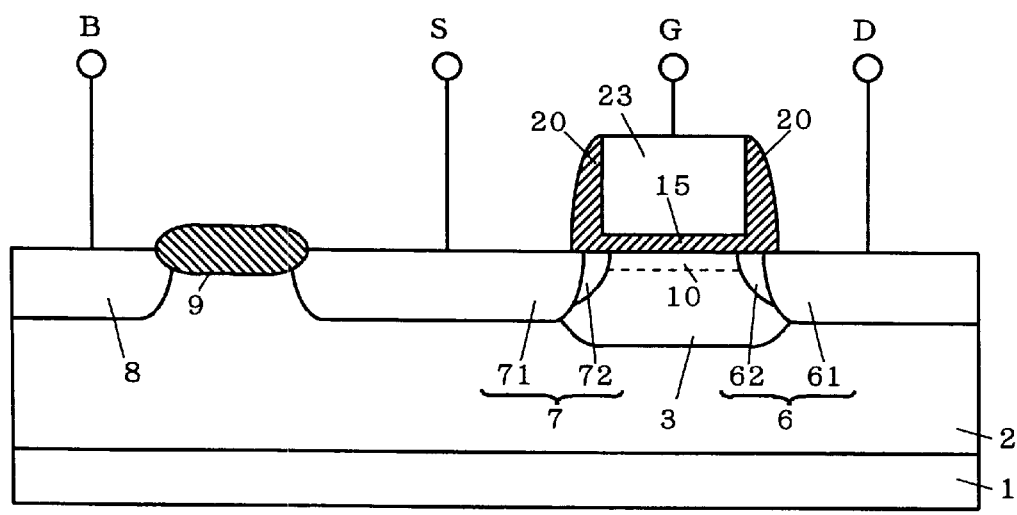
FIG. 27 is a schematic view showing another example of the section of the main part of the insulated gate transistor according to the fifth embodiment.
Figure 28:
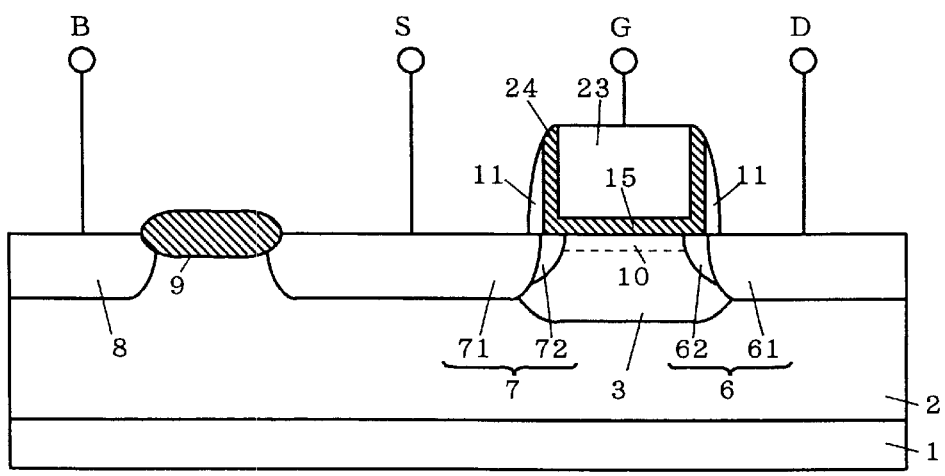
FIG. 28 is a schematic view showing yet another example of the section of the main part of the insulated gate transistor according to the fifth embodiment.
Figure 29:
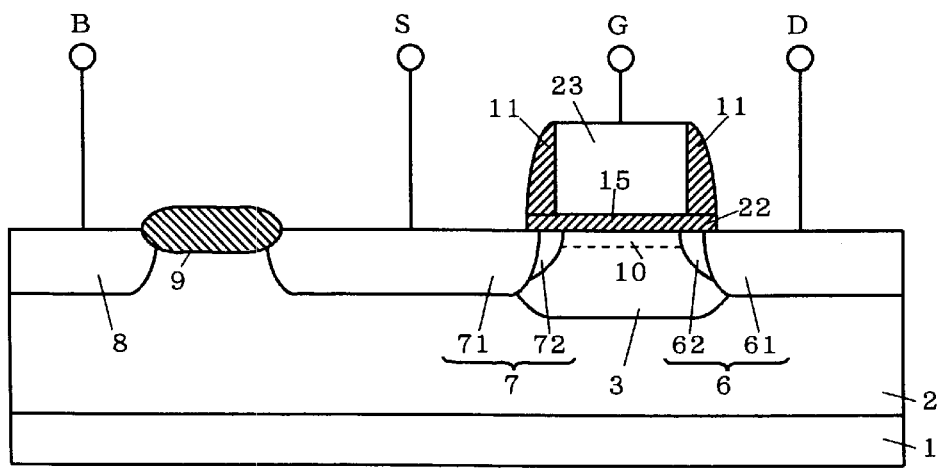
FIG. 29 is a schematic view showing a further example of the section of the main part of the insulated gate transistor according to the fifth embodiment.

In the case where a sidewall 20 formed of a ferroelectric is used as shown in FIG. 27, a layer 24 formed of a ferroelectric is provided along an internal wall of a sidewall 11 as shown in FIG. 28 or a ferroelectric film is formed up to a region 22 provided under the sidewall 11 as shown in FIG. 29, the above-mentioned effects can be enhanced.

Sixth Embodiment

Figure 30:
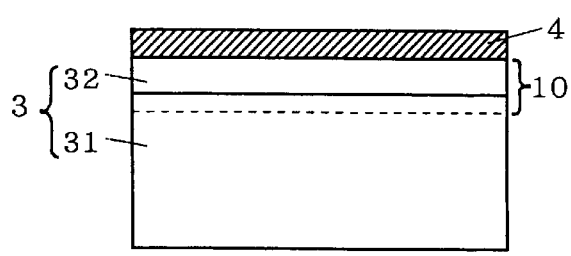
FIG. 30 is a schematic view showing an example of a section of a main part of an insulated gate transistor according to a sixth embodiment.

FIG. 30 is a typical enlarged view showing a section of a main part in the vicinity of a channel of an insulated gate transistor according to a sixth embodiment. The insulated gate transistor shown in FIG. 30 has a channel dope region 3 formed by two layers, that is, a P type first region 31 and an N type second region 32. An N type semiconductor layer 32 is provided on a surface of the channel dope region 3 formed under a gate insulation film 4, that is, a region 10 where a channel is to be formed. The other portion of the channel dope region 3 is the first region 31. Other portions such as a gate electrode and the like have the same structures as those in the insulated gate transistor according to the first embodiment.

The insulated gate transistor shown in FIG. 30 is a buried channel type transistor according to the prior art. If the channel dope region has two layers, a subthreshold coefficient is increased due to a parasitic capacitance generated by pn junction in the channel dope region.

In the insulated gate transistor in which a gate electrode 12 is depleted, however, an effective thickness of the gate insulation film 4 is changed with an applied gate voltage so that the subthreshold coefficient can be reduced. Thus, the problem of the prior art can be solved.

By a buried channel, the P type first region 31 doped with an impurity having a comparatively high concentration can suppress punch-through. Furthermore, a characteristic of the second region 32 such as an impurity concentration is controlled so that a threshold voltage of the insulated gate transistor can be controlled.

Even if the impurity concentration of the channel dope region 3 is reduced, the punch-through is caused with difficulty. In addition, the second region 32 controls the threshold voltage. For this reason, it is easy to prevent the threshold voltage of the transistor from being increased due to a reduction in a work function of the gate electrode 12 caused by using a P type semiconductor layer for the gate electrode 12.

If the insulated gate transistor has a P channel, a conductivity type of the gate electrode 12 is reverse to that of each of the first and second regions 31 and 32 of the channel dope region 3.

Seventh Embodiment

Figure 31:
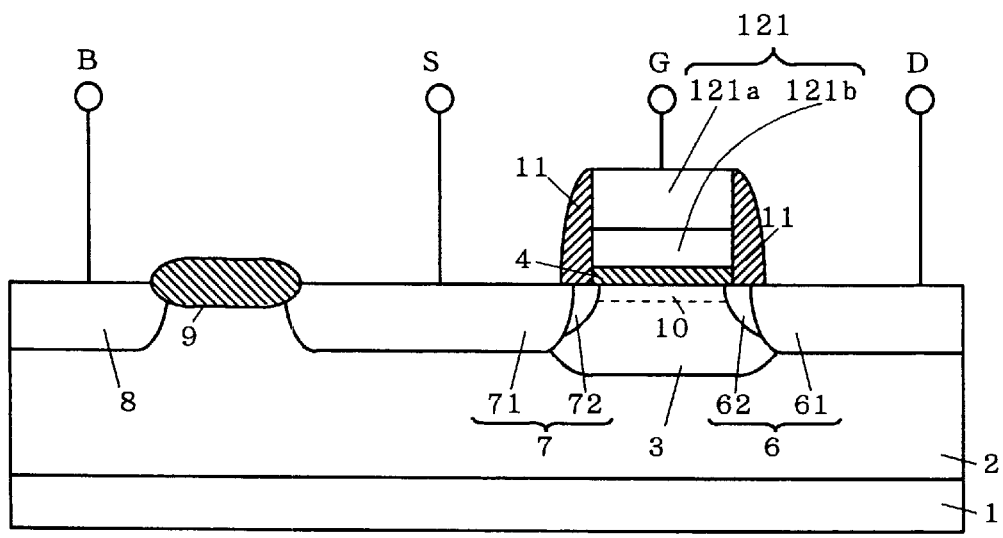
FIG. 31 is a schematic view showing an example of a section of a main part of an insulated gate transistor according to a seventh embodiment.

FIG. 31 is a schematic view showing a section of a main part of a structure of an insulated gate transistor according to a seventh embodiment of the present invention. In FIG. 31, the same reference numerals as those in FIG. 1 denote corresponding portions, and the reference numeral 121 denotes a gate electrode including a semiconductor region 121a formed of a semiconductor having a low impurity concentration and an electric conductor 121b which is formed on a gate insulation film 4 and has a greater work function than that of a channel region 10. The semiconductor region 121a is formed of a polycrystalline silicon film doped with boron having a low concentration, for example. A conductivity type of the gate electrode 121 is different from that of a source-drain region.

In this case, it is possible to obtain the same effects as those in the case where a P type semiconductor material having a great work function and a low impurity concentration is used for the gate electrode 121 described in the first embodiment, and the same effects as those in the second embodiment. More specifically, the electric conductor 121b having a greater work function is used for a region of the gate electrode 121 which is provided in contact with the gate insulation film 4 in an NMOS transistor. Therefore, a difference $\Phi MS$ between work functions of the Equation 10 is reduced so that conditions for depletion are relaxed. Thus, it is easy to set the impurity concentration of a channel dope region comparatively high.

The case where an N-channel MOS transistor is used has been described in the seventh embodiment. In the case where a P-channel insulated gate transistor is used, the semiconductor region 121a of the gate electrode has a conductivity type of N. In this case, the electric conductor 121b is formed of a material having a smaller work function than that of the channel dope region.

Eighth Embodiment

Figure 32:
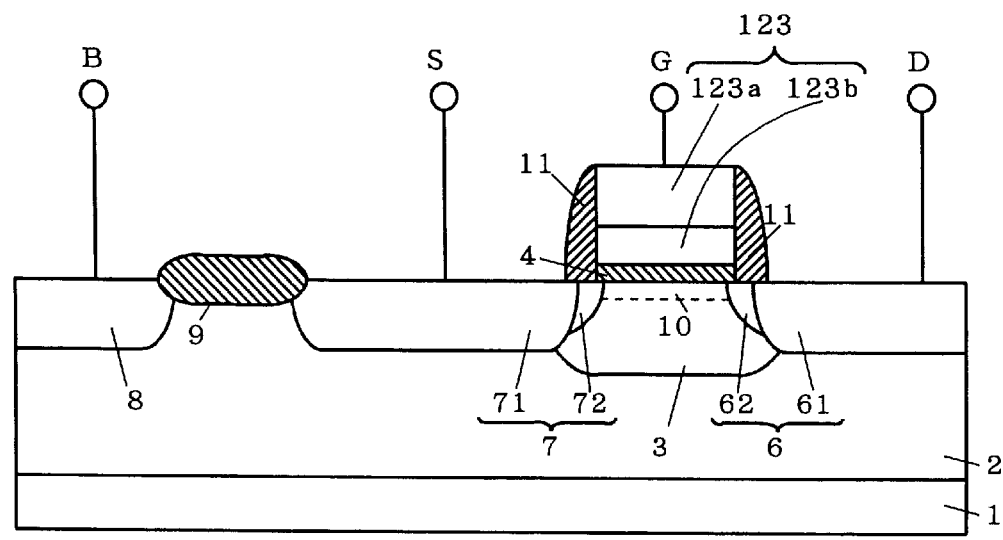
FIG. 32 is a schematic view showing an example of a section of a main part of an insulated gate transistor according to an eighth embodiment.

FIG. 32 is a schematic view showing a section of a main part of a structure of an insulated gate transistor according to an eighth embodiment of the present invention. In FIG. 32, the same reference numerals as those in FIG. 1 denote corresponding portions, and the reference numeral 123 denotes a gate electrode 123 including a semiconductor region 123a formed of a semiconductor having a low impurity concentration and a semiconductor layer 123b which is formed on a gate insulation film 4 and has a small bandgap and a low impurity concentration, for example, germanium or the like. The gate electrode is formed of a polycrystalline silicon film doped with boron having a low concentration, for example. For this reason, a conductivity type of the gate electrode 123 is different from that of a source-drain region.

In this case, attention is paid to the bandgap in a structure for reducing a work function. It is possible to obtain the same effects as those obtained in the case where the P type semiconductor material having a small bandgap and a low impurity concentration is used for the gate electrode 12 as described in the first embodiment. Furthermore, the same effects as those in the second embodiment can be obtained. More specifically, the semiconductor layer 123b having the small bandgap is used in a region of the gate electrode 123 which is provided in contact with the gate insulation film 4 in an NMOS transistor. Therefore, a negative value is obtained by subtracting a bandgap Eg1 from a bandgap Eg2 in the Equation 10 so that conditions for depletion are relaxed. Consequently, the depletion can easily be performed. Thus, the impurity concentration of a channel dope region can be set comparatively high.

The case where an N- channel MOS transistor is used has been described in the eighth embodiment. In the case where a P-channel insulated gate transistor is used, the semiconductor region 123a of the gate electrode 123 has a conductivity type of N. In this case, the semiconductor layer 123b is formed of a material having a greater bandgap than that of a channel dope region 3.

In the case where the N-channel transistor is used, the same effects can be obtained even if an electron affinity of the semiconductor layer 123b is smaller than that of the channel dope region 3.

In the case where the N-channel transistor is used, the same effects can be obtained even if a difference between an intrinsic Fermi level of the semiconductor layer 123b and a quasi-Fermi level thereof is greater than that of the channel dope region 3.

Ninth Embodiment

Since the impurity concentration of the gate electrode 12, 23, 121, 123 of the insulated gate transistors according to the first to eighth embodiments, the gate electrode 12, 23, 121, 123 is depleted with a drain voltage and current driving force is reduced in an ON state depending on setting of elements related to depletion such as the impurity concentration of the gate electrode 12, 23, 121, 123 and the like.

An insulated gate transistor according to a ninth embodiment has a structure for preventing the current driving force from being reduced.

Figure 33:
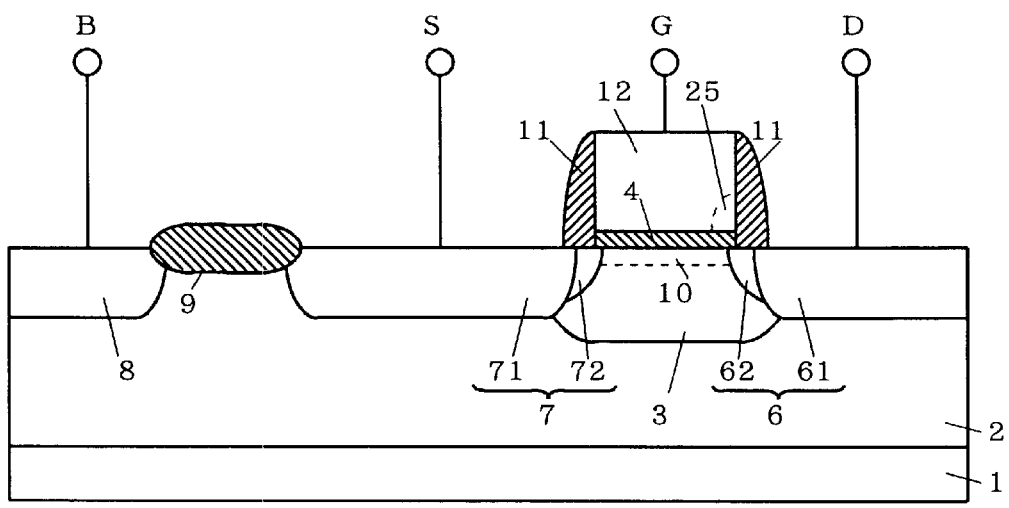
FIG. 33 is a schematic view showing an example of a section of a main part of an insulated gate transistor according to a ninth embodiment.

FIG. 33 is a schematic view showing a section of a main part of a structure of the insulated gate transistor according to the ninth embodiment of the present invention. In FIG. 33, the reference numeral 25 denotes an impurity region having a high concentration which is formed on a corner of a gate insulation film 4 of a gate electrode 12 and a sidewall 11 in the vicinity of a drain region 6, and the same reference numerals as those in FIG. 1 denote corresponding portions.

The impurity region 25 has the same conductivity type as that of the other portion of the gate electrode 12, and has an impurity concentration which is higher than that of the other portion of the gate electrode 12. For this reason, a depletion layer is generated with more difficulty in the impurity region 25 of the gate electrode 12 which is provided in contact with the gate insulation film 4 than in the other region of the gate electrode 12. Consequently, the current driving force can be prevented from being reduced due to the depletion layer generated in the ON state.

Figure 34:
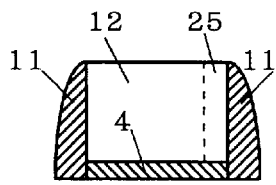
FIG. 34 is a schematic view showing another example of the section of the main part of the insulated gate transistor according to the ninth embodiment.
Figure 35:
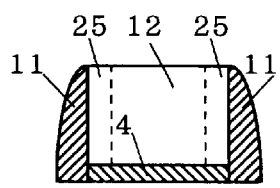
FIG. 35 is a schematic view showing yet another example of the section of the main part of the insulated gate transistor according to the ninth embodiment.

The impurity region 25 is formed by the following method. More specifically, an impurity is implanted in the same manner as in the other portion of the impurity region 25, then so-called angle implantation is performed in which an offset angle is formed on a wafer in a direction of ion beam irradiation, and thereafter the impurity is implanted. FIGS. 34 and 35 are schematic views showing a section of a main part of a structure in the vicinity of the gate electrode of the insulated gate transistor. While the impurity region 25 has been formed in any of four corners of the gate electrode 12 which is the closest to the drain region 6 in FIG. 33, it may be formed along the sidewall 11 as shown in FIG. 34 or 35 to obtain the same effects as those in FIG. 33.

Figure 36:
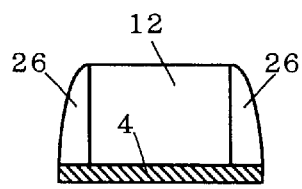
FIG. 36 is a schematic view showing a further example of the section of the main part of the insulated gate transistor according to the ninth embodiment.

As shown in FIG. 36, a sidewall 26 to which an impurity having a high concentration is added may be formed as a sidewall on a side close to the drain region 6 to obtain the same effects as those in the ninth embodiment.

Tenth Embodiment

Figure 37:
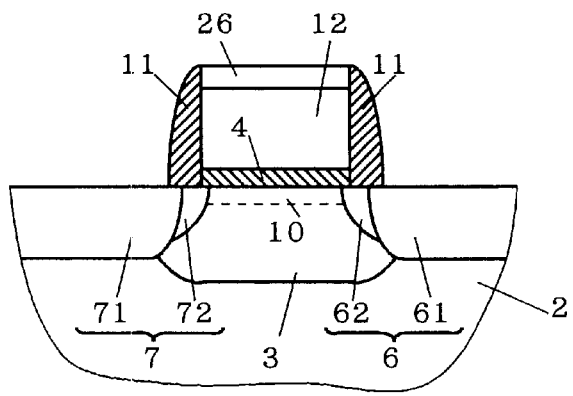
FIG. 37 is a schematic view showing an example of a section of a main part of an insulated gate transistor according to a tenth embodiment.
Figure 38:
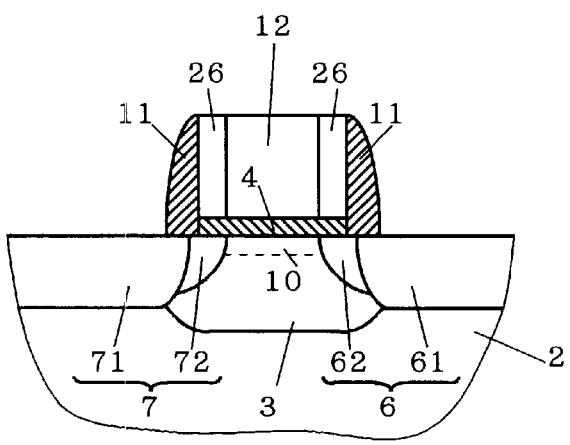
FIG. 38 is a schematic view showing another example of the section of the main part of the insulated gate transistor according to the tenth embodiment.
Figure 39:
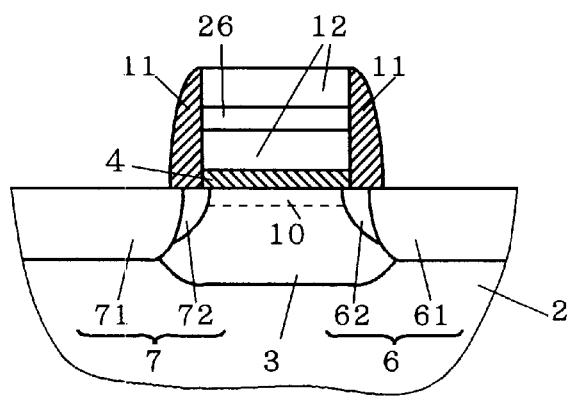
FIG. 39 is a schematic view showing a further example of the section of the main part of the insulated gate transistor according to the tenth embodiment.

FIGS. 37 to 39 are schematic views showing a section of a main part of a structure in the vicinity of a gate electrode of an insulated gate transistor according to a tenth embodiment of the present invention. In FIGS. 37 and 38, the reference numeral 26 denotes a resistance layer having a lower resistivity than in the other region of a gate electrode 12, and the same reference numerals as those in FIG. 1 denote corresponding portions. The resistance layer 26 is formed of an electric conductor such as a metal, or a semiconductor having a high impurity concentration. If a semiconductor having a low concentration is used for the gate electrode 12, a gate resistance is increased so that an operating speed of an element is decreased.

A resistance value in a direction of a thickness of the gate electrode 12 which is equivalent to a vertical direction in the drawing does not become a problem because the thickness of the gate electrode 12 is small. If the resistance layer 26 is provided on a part of the gate electrode 12, a resistance in a direction of a length of a gate can remarkably be reduced so that operation delay of the element can be prevented. For this reason, the resistance layer 26 is provided on a part of a section of the gate electrode 12 but continuously extends in a direction perpendicular to the drawing. While the resistance layer 26 in the section of the gate electrode 12 may be arranged in a manner other than in FIGS. 37 to 39, it cannot be provided in a region that is provided in contact with a gate insulation film 4 where a channel is to be formed. The resistance layer 26 can be provided above region 62 or 72. The reason is that the region of the gate electrode 12 on the channel which is provided in contact with the gate insulation film 4 is depleted so that effects of the present invention can be obtained. If a depletion layer is not formed by existence of the resistance layer 26, the effects of the present invention cannot be obtained.

Eleventh Embodiment

Figure 40:
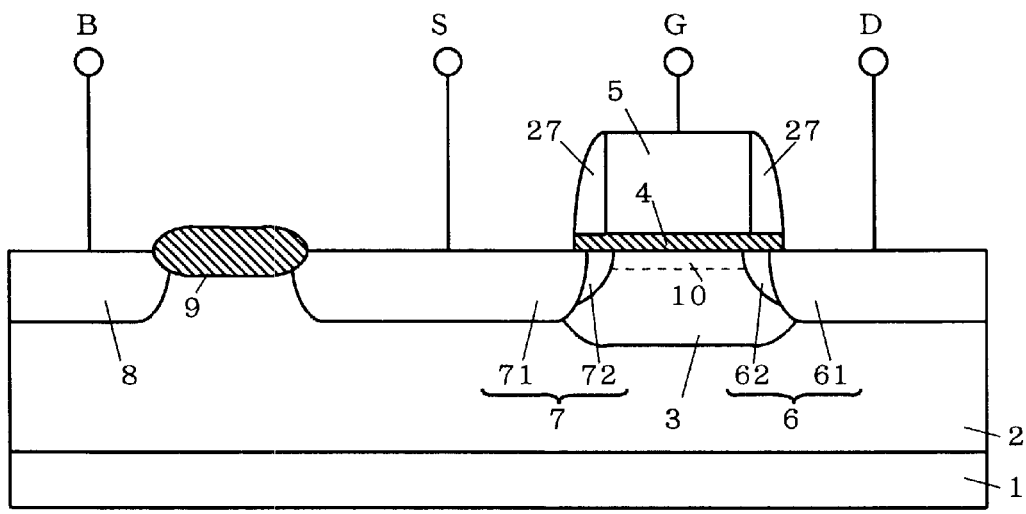
FIG. 40 is a schematic view showing an example of a section of a main part of an insulated gate transistor according to an eleventh embodiment.

FIG. 40 is a schematic view showing a section of a main part of a structure of an insulated gate transistor according to an eighth embodiment of the present invention. In FIG. 40, the reference numeral 27 denotes a sidewall made of a semiconductor material having a low impurity concentration, and the same reference numerals as those in FIG. 1 denote corresponding portions. A conductivity type of the sidewall 27 is different from that of each of a source region 6 and a drain region 7. In a region of the sidewall 27 which is provided in contact with a gate insulation film 4, a depletion layer is formed in an OFF state of the transistor. When the transistor is turned on, the depletion layer is generated. When the transistor is turned off, the depletion layer disappears or a width thereof is reduced. Accordingly, an impurity concentration of the sidewall 27 which is to be required is calculated on almost the same conditions as those of the impurity concentration of the gate electrode 12 described in the first embodiment.

In the case where such a sidewall 27 is used, an electric field generated between a gate electrode 5 and a drain region 62 through the sidewall 27 and the gate insulation film 4 is relieved. In particular, consequently, hot carriers are inhibited from being injected into the gate insulation film 4 provided under the sidewall 27 and a tunneling leak current between bands is suppressed.

Figure 41:
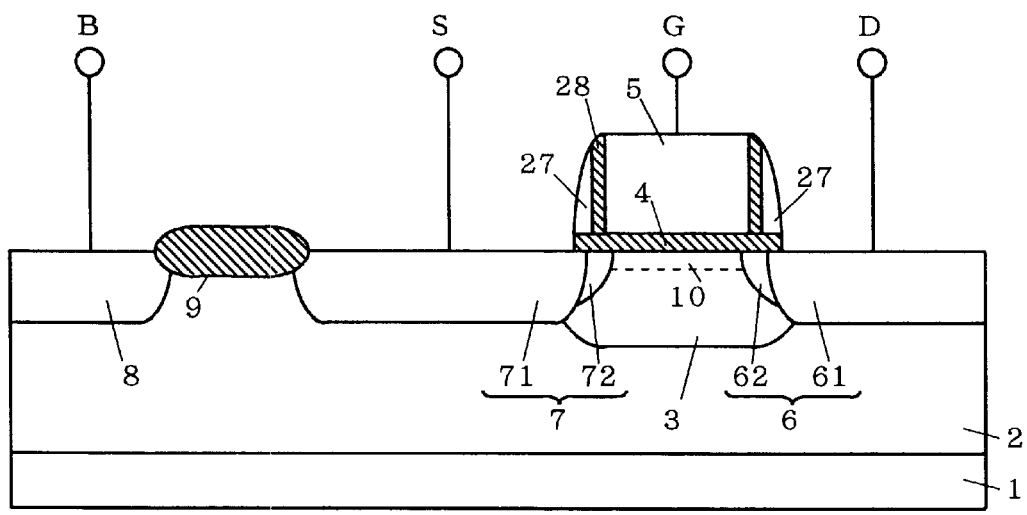
FIG. 41 is a schematic view showing another example of the section of the main part of the insulated gate transistor according to the eleventh embodiment.
Figure 42:
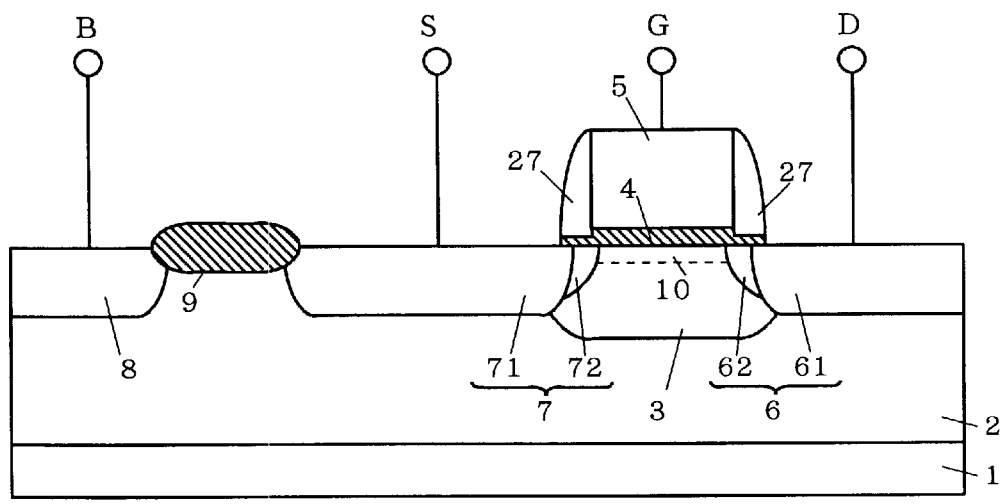
FIG. 42 is a schematic view showing a further example of the section of the main part of the insulated gate transistor according to the eleventh embodiment.

As shown in FIG. 41, an insulation film 28 may be formed between the sidewall 27 and the gate electrode 5. As shown in FIG. 42, furthermore, a thickness of the gate insulation film 4 may be varied under the side wall 27 and the gate electrode 5.

Twelfth Embodiment

Figure 72:
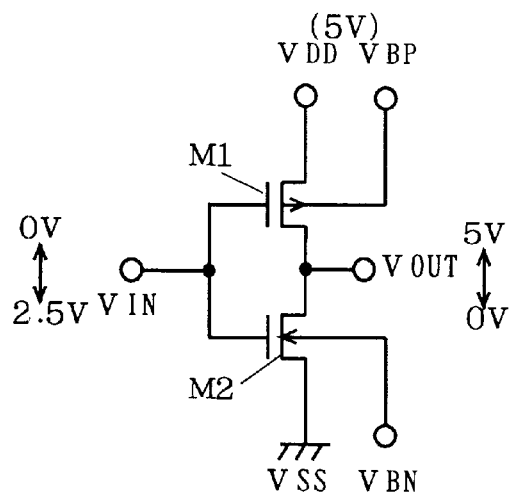
FIG. 72 is a circuit diagram showing a structure of an inverter using a MOS transistor.
Figure 73:
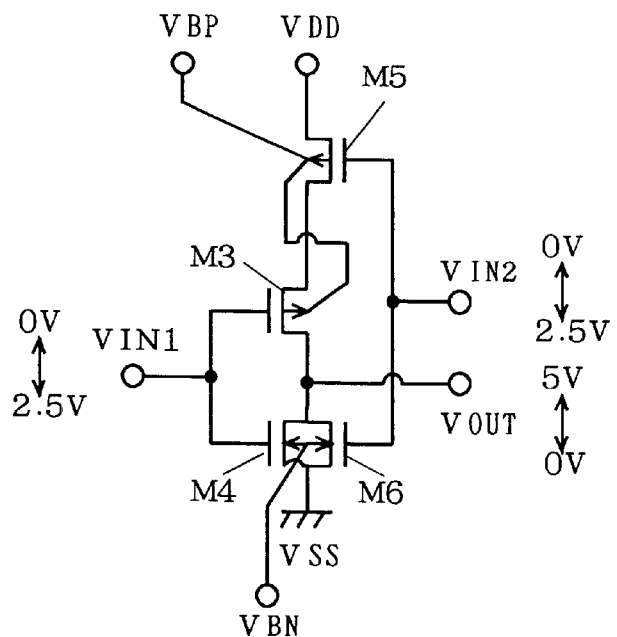
FIG. 73 is a circuit diagram showing a structure of an OR circuit using the MOS transistor.
Figure 74:
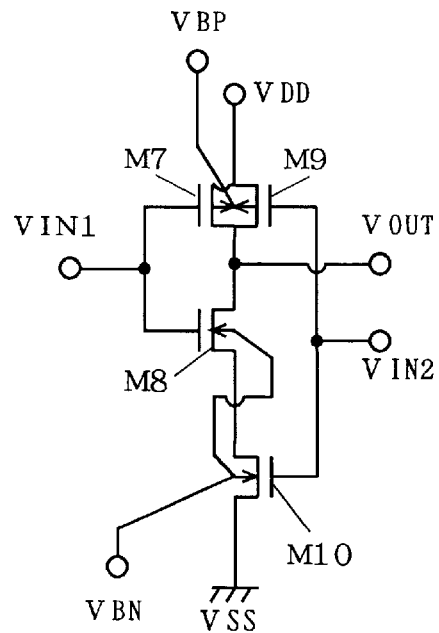
FIG. 74 is a circuit diagram showing a structure of a NAND circuit using the MOS transistor.

As shown also in FIGS. 72 to 74, a voltage which is different from a supply voltage of an internal circuit is applied to an I/O stage of a circuit for an interface with an external circuit and a plurality of circuits having various supply voltages are mixed in one chip in some cases. In those cases, it is necessary to set a breakdown voltage of a transistor which is a part of the circuit greater than that of each of other transistors. A method for using an insulated gate transistor comprising a gate electrode which is depleted in order to cope with the above-mentioned cases will be described below.

Figure 43:
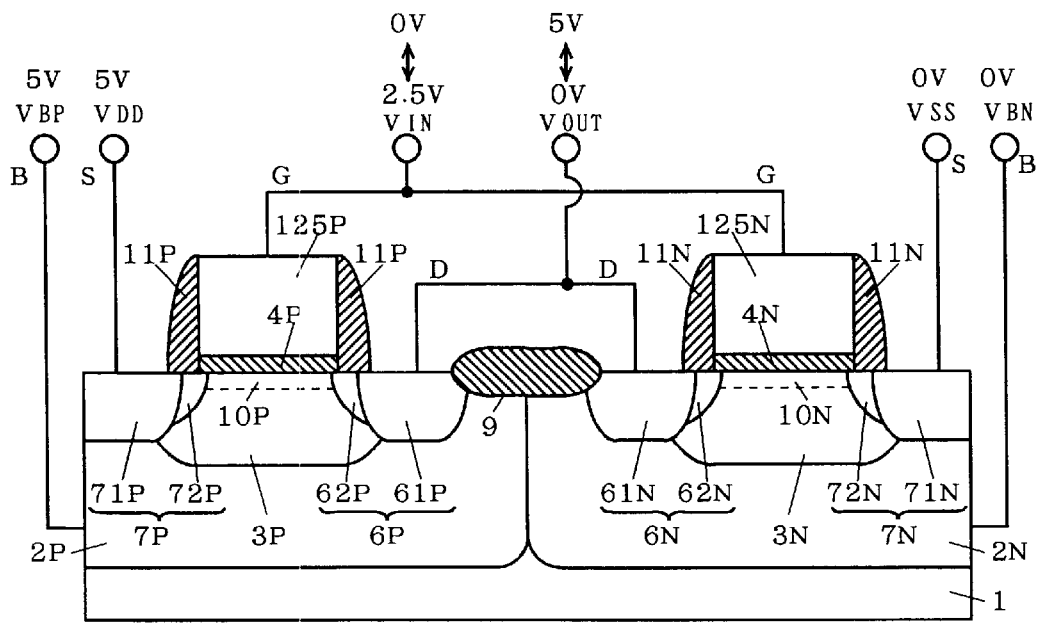
FIG. 43 is a schematic view showing an example of a section of a main part of an insulated gate transistor forming a CMOS inverter according to a twelfth embodiment.

FIG. 43 is a schematic view showing a section of a main part of an insulated gate transistor forming an inverter according to a twelfth embodiment of the present invention. In FIG. 43, the reference numeral 125 denotes a gate electrode of an N-channel MOS transistor or a P-channel MOS transistor using a material which is depleted with a gate voltage of 0 V, and the same reference numerals as those in FIG. 1 denote corresponding portions. In FIG. 43, numerals having N appended thereto are related to a structure of the N-channel MOS transistor, and numerals having P appended thereto are related to a structure of the P-channel MOS transistor. An external supply voltage VDD is 5 V, a gate voltage VG is 0 V or 2.5 V, a source voltage VSS is 0 V, a substrate voltage VBP is 5 V, and a substrate voltage VBN is 0 V. An internal supply voltage is 2.5 V. For this reason, an input voltage VIN, that is, the gate voltage VG has a value of 0 V or 2.5 V.

In the N-channel and P-channel MOS transistors shown in FIG. 43, when a gate voltage VG is 0 V, that is, the N-channel MOS transistor is turned off and the P-channel MOS transistor is turned on, a maximum potential difference which is greater than a maximum potential difference generated by only the internal supply voltage is applied to respective gate insulation films 4N and 4P with the external supply voltage VDD.

A gate electrode 125N of the N-channel MOS transistor is formed of a P type semiconductor material having a low impurity concentration. Therefore, the gate electrode 125N is depleted when the transistor is off, and an electric field for the gate insulation film 4N is effectively relieved. Consequently, the gate insulation film 4N can have the same thickness as that of a gate insulation film of an internal circuit (not shown) which generates the input voltage VIN. For this reason, it is possible to simplify the process as described in the first embodiment and to enhance a breakdown voltage by a reduction in defects of the gate insulation film 4N. By properly adjusting the impurity concentration of the gate electrode 125N, a depletion layer width can be regulated in the vicinity of a drain of the N-channel MOS transistor to which the maximum potential difference is applied. Consequently, a degree of the breakdown voltage can also be regulated easily.

In the N-channel MOS transistor, a low OFF-state leak current can be attained even if a threshold is small as described in the first to fourth embodiments and the sixth to tenth embodiments. In addition, current driving force can be increased. At the same time, an element having high reliability can be obtained.

Furthermore, a maximum electric field is generated on the gate insulation film 4P when the P-channel MOS transistor is on. For this reason, a gate electrode 125P formed of a P type semiconductor having a low impurity concentration is used. Consequently, when the P-channel MOS transistor is on, the gate electrode 125P is depleted so that an electric field of the gate insulation film 4P can effectively be relieved. Therefore, even if the gate insulation film 4P has the same thickness as that of the gate insulation film of the internal circuit, a high breakdown voltage can be obtained. A depletion layer width of the gate electrode 4P can be controlled with an impurity concentration of the gate electrode 4P. Consequently, a breakdown voltage of the gate insulation film 4P can be controlled by regulating the impurity concentration of the gate electrode 125P.

Figure 44:
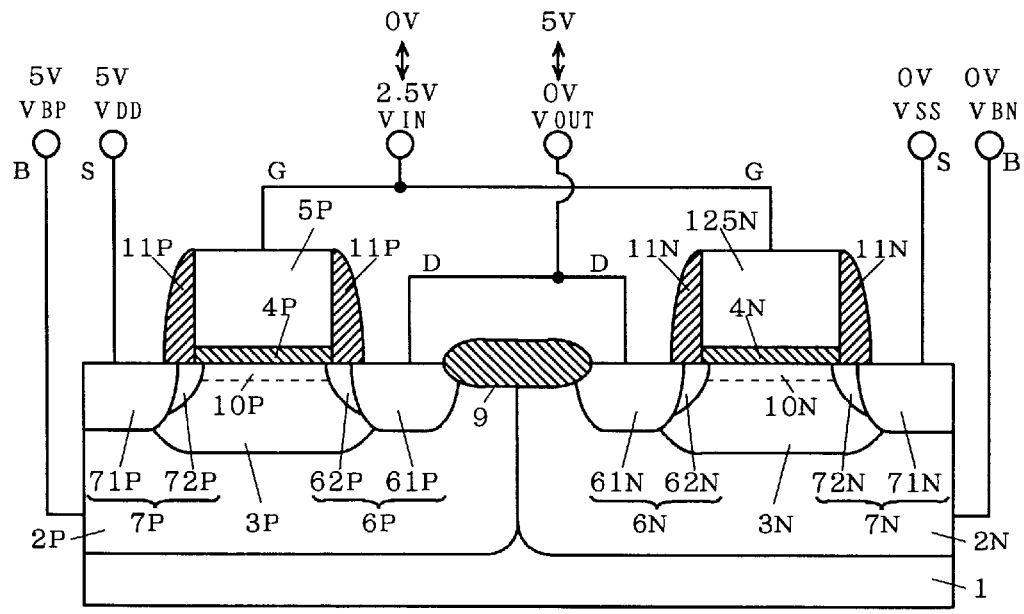
FIG. 44 is a schematic view showing another example of the section of the main part of the insulated gate transistor forming the CMOS inverter according to the twelfth embodiment.
Figure 45:
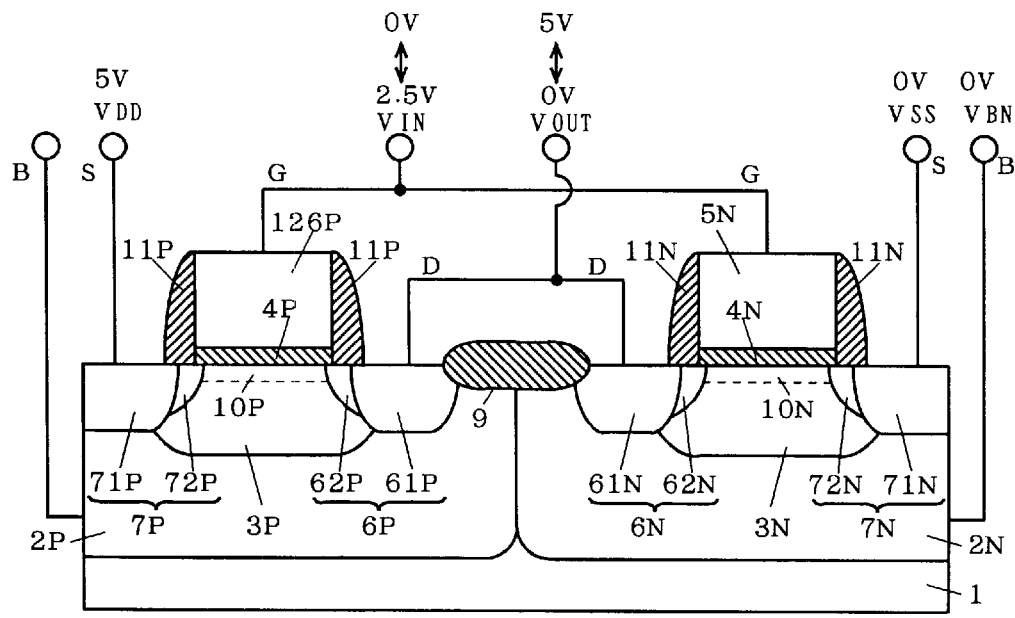
FIG. 45 is a schematic view showing yet another example of the section of the main part of the insulated gate transistor forming the CMOS inverter according to the twelfth embodiment.

As shown in FIG. 44, even if only the P-channel MOS transistor has a gate electrode 5P on which a depletion layer is not formed, the above-mentioned effects can be obtained in a gate electrode 125N of an N-channel MOS transistor. As shown in FIG. 45, even if only an N-channel MOS transistor has a gate electrode 5N on which the depletion layer is not formed, the above-mentioned effects can be obtained in a gate electrode 125P of a P-channel MOS transistor.

Figure 46:
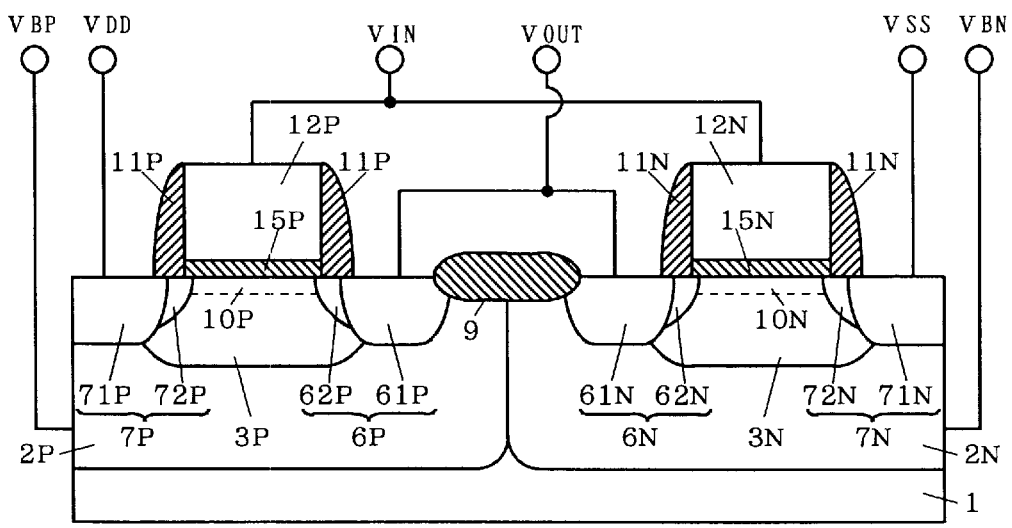
FIG. 46 is a schematic view showing a further example of the section of the main part of the insulated gate transistor according to the twelfth embodiment.

A plurality of transistors which comprise gate insulation films including ferroelectric films and have various polarities can be used to form a CMOS circuit. For example, FIG. 46 is a schematic view showing a section of main parts of N-channel and P-channel MOS transistors which comprise gate insulation films 15N and 15P made of a ferroelectric and form a CMOS inverter circuit. In FIG. 46, the same reference numerals as those in FIG. 9 denote corresponding portions. In FIG. 46, numerals having N appended thereto are related to a structure of the N-channel MOS transistor, and numerals having P appended thereto are related to a structure of the P-channel MOS transistor.

Figure 47:
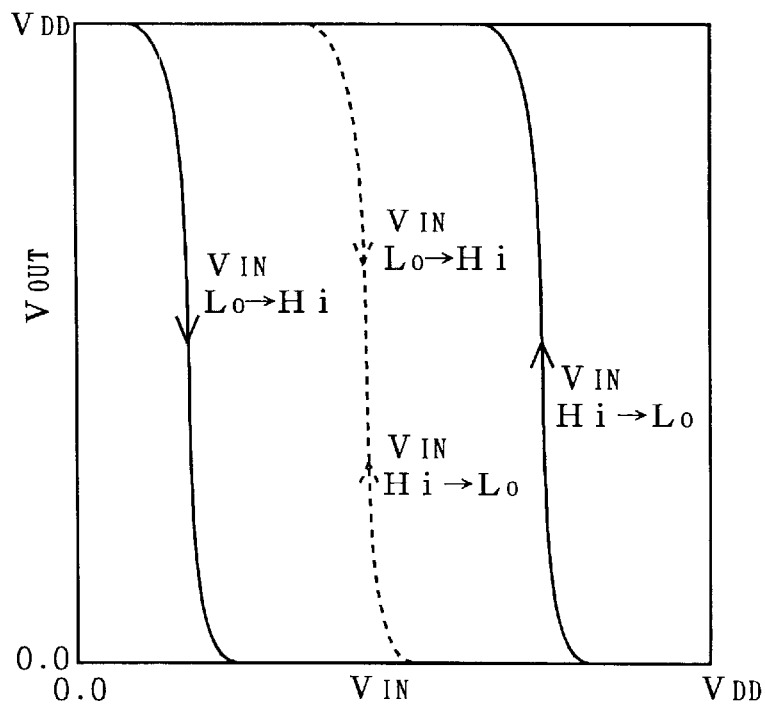
FIG. 47 is a graph showing operation of the transistor in FIG. 46.

The CMOS inverter shown in FIG. 46 has transfer characteristics shown in FIG. 47. Depending on the way of a change (a change from the High level to the Low level or from the Low level to the High level), an output voltage VOUT is varied even if an input voltage VIN is the same. Accordingly, a graph which has an axis of abscissa indicating the input voltage VIN and an axis of ordinate indicating the output voltage VOUT makes a hysteresis curve. In FIG. 47, a dotted line indicates a characteristic obtained in the case where the gate insulation film does not include a ferroelectric. If a standby point is set between a voltage falling from the Low level to the High level and a voltage rising from the High level to the Low level on the hysteresis curve, a memory cell can also be formed in two states of the High and Low levels.

The structure of the transistor may be similar to that of each of the transistors shown in FIGS. 19 to 21, and the same effects as those in the fourteenth embodiment can be obtained. Gate electrodes 12P and 12N may be formed by the gate electrode 23 shown in FIG. 22.

Thirteenth Embodiment

Figure 48:
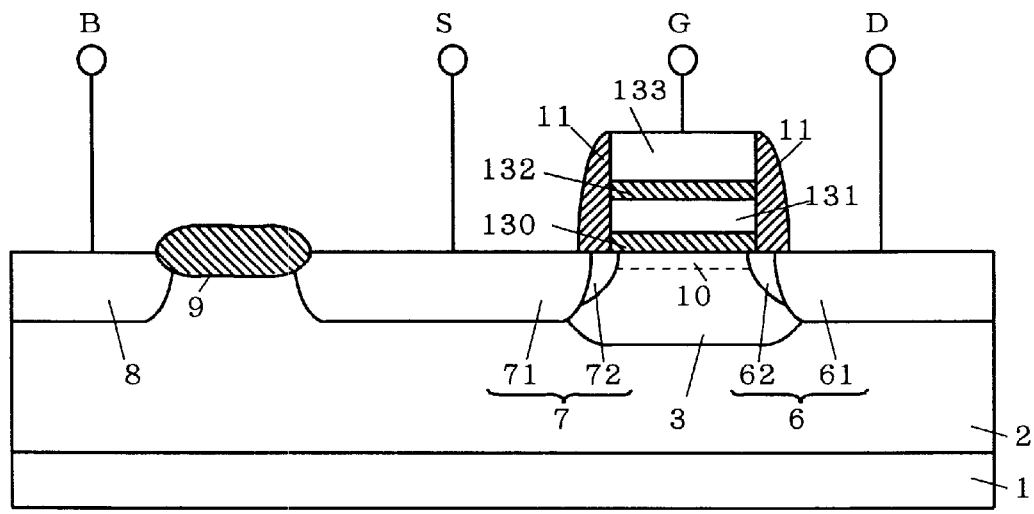
FIG. 48 is a schematic view showing an example of a section of a main part of an insulated gate transistor according to a thirteenth embodiment.

FIG. 48 is a schematic view showing a section of a main part of a structure of an insulated gate transistor according to a thirteenth embodiment of the present invention. In FIG. 48, the reference numeral 130 denotes a first gate insulation film formed on a silicon substrate 1, the reference numeral 131 denotes a first gate electrode formed on the first gate insulation film 130, the reference numeral 132 denotes a second gate insulation film formed on the first gate electrode 131, the reference numeral 133 denotes a second gate electrode formed on the second gate insulation film 132, and the same reference numerals as those in FIG. 1 denote corresponding portions.

In the case where the transistor shown in FIG. 48 forms a flash memory cell, the first gate electrode 131 is a floating gate for storing information and the second gate electrode 133 is a control gate for giving a gate potential corresponding to the information. At this time, a terminal D connected to a drain of the transistor is connected to a bit line of the flash memory, a terminal G connected to a gate is connected to a word line, and a terminal S connected to a source is connected to a source line. A terminal B serves to give a back gate voltage.

A so-called N-channel transistor will be described below, in which a channel is turned on when a positive voltage is applied between the terminals D and S and between the terminals D and G. Also in a P-channel transistor, the same effects can be obtained. In the N-channel transistor, the second gate electrode 133 should have a structure in which a P type impurity layer having a low impurity concentration is formed at least in the vicinity of the second gate insulation film 132.

When a voltage V is applied to the terminal G, a voltage V1 applied to the first gate insulation film 130 is calculated by Equation 13, wherein C1 represents a capacitance of a capacitor formed by using, as electrodes, the first gate electrode 131 and a channel dope region 3 provided on both sides of the first gate insulation film 130, and C2 represents a capacitance of a capacitor formed by using, as electrodes, the first and second gate electrodes 131 and 133 provided on both ends of the second gate insulation film 132.

Accordingly, if the capacitance C2 is greater than the capacitance C1, a voltage applied to the both ends of the first gate insulation film 130 is increased.

$$V1 = \frac{C2}{(C1+C2)} \times V \tag{13}$$

In the case where the positive voltage V is applied to the terminal G to form the channel, the transistor is formed to have a structure in which the first gate electrode 131 that is provided in contact with the first gate insulation film 130 is depleted to reduce C1. Consequently, the voltage V1 applied to the electrodes on both ends of the first gate insulation film 130 is increased. In consideration of a voltage applied to a depletion layer in the first gate electrode 131, the voltage applied to the first gate insulation film 130 is reduced. In other words, a potential of the channel is not increased and current driving force is reduced.

In order not to decrease the number of carriers in the channel but to increase the current driving force, accordingly, it is preferable that the first gate electrode 131 which is provided in contact with the first gate insulation film 130 should not extend to the depletion layer when the positive voltage is applied.

If the capacitance C2 is increased and the voltage V1 applied to the first gate insulation film 130 is increased, the potential in the channel is increased so that more carriers are generated. Therefore, it is preferable that the semiconductor layers of the first and second gate electrodes 131 and 133 which are provided in contact with the second gate insulation film 132 should not be depleted.

Accordingly, an N type impurity layer having a low impurity concentration or a P type impurity layer having a high impurity concentration is formed on a second gate insulation film 132 side of the first gate electrode 131, and an N type impurity layer having a high impurity concentration or a P type impurity layer having a low impurity concentration is formed on a first gate insulation film 130 side of the first gate electrode 131.

A region of the first gate electrode 131 which is provided in contact with the first gate insulation film 130 is formed of an N type semiconductor having a high impurity concentration to which a depletion layer extends with difficulty or a P type semiconductor having a low impurity concentration which is accumulated on this condition. Therefore, the first gate electrode 131 which is provided in contact with the first gate insulation film 130 is not depleted.

A region of the first gate electrode 131 which is provided in contact with the second gate insulation film 132 is formed of an N type semiconductor having a low impurity concentration which is accumulated on the condition for applying a voltage or a P type semiconductor having a high impurity concentration to which the depletion layer does not extend. A region of the second gate electrode 133 which is provided in contact with the second gate insulation film 132 is formed of a P type semiconductor having a low impurity concentration which is accumulated on the condition for applying a voltage. Therefore, the second gate electrode 132 is formed of a P type semiconductor having a low impurity concentration which is accumulated on the condition for applying a voltage. Consequently, the first and second gate electrodes 131 and 133 which interpose the second gate insulation film 132 therebetween are not depleted. Thus, a transistor having high current driving force can be obtained.

When a voltage of 0 V or a negative voltage is applied to the terminal G. the region of the second gate electrode 133 which is provided in contact with the second gate insulation film 132 is depleted. Also in the first gate electrode 131, the N type impurity layer having a low impurity concentration which is provided in contact with the second gate insulation film 132 or the P type impurity layer having a low impurity concentration which is provided in contact with the first gate insulation film 130 is depleted.

In the case where the depletion layer extends to the N type impurity layer having a low impurity concentration of the first gate electrode 131, it extends to both sides of the second gate insulation film 132. Consequently, the capacitance C2 is reduced so that a voltage applied to the channel is reduced.

In the case where the depletion layer extends to the P type impurity layer having a low impurity concentration of the first gate electrode 131, the capacitance C1 is reduced by the depletion so that a voltage applied between the first gate electrode 131 and the channel is increased. However, an effective thickness of the first gate insulation film 130 is increased. Therefore, the voltage applied to the channel is reduced.

In the case where the channel is formed and the transistor is turned on, the depletion layer does not extend to the first gate electrode 131 so that a sufficient voltage can be applied to the channel. In the case where the channel disappears and the transistor is turned off, the voltage applied to the channel can be reduced. Therefore, a low OFF-state leak current can be obtained with a low threshold as described in the first to fourth embodiments and the sixth to tenth embodiments. In addition, the current driving force can be increased. At the same time, an element having high reliability can be obtained.

Furthermore, a conductivity type of the first gate electrode 131 which is provided in contact with the first gate insulation film 130 can be set to N and P. Therefore, a work function of the first gate electrode 131 can optionally be selected so that a degree of freedom of setting of a threshold voltage can be increased.

Figure 49:
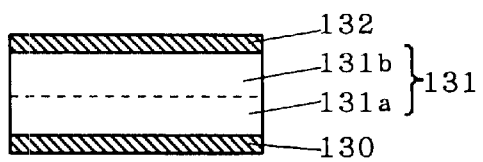
FIG. 49 is a schematic view showing another example of the section of the main part of the insulated gate transistor according to the thirteenth embodiment.
Figure 50:
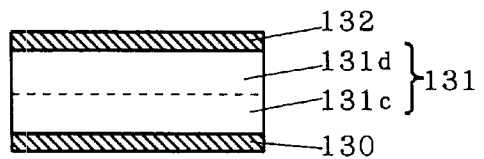
FIG. 50 is a schematic view showing a further example of the section of the main part of the insulated gate transistor according to the thirteenth embodiment.

If a drain region 6 and a source region 7 have a first conductivity type, the first gate electrode 131 can be formed by a first region 131*a* of a first conductivity type having a high impurity concentration which is provided in contact with the first gate insulation film 130 and a second region 131*b* of the first conductivity type having a low impurity concentration which is provided in contact with the second gate insulation film 132 as shown in FIG. 49, and can be formed by a first region 131*c* of a second conductivity type having a low impurity concentration which is provided in contact with the first gate insulation film 130 and a second region 131*d* of the second conductivity type having a high impurity concentration which is provided in contact with the second gate insulation film 132 as shown in FIG. 50.

In the case where the transistor is used for the flash memory cell, the second gate electrode 133 is depleted so that the effective thickness of the second gate insulation film 132 is increased when waiting for storing and holding charges acting as information. Consequently, a leak current which leaks through the second gate insulation film 132 can be reduced. As a result, the thickness of the second gate insulation film 132 can be reduced so that the voltage V1 applied to the first gate insulation film 130 can be increased when the transistor is turned on.

Fourteenth Embodiment

Figure 51:
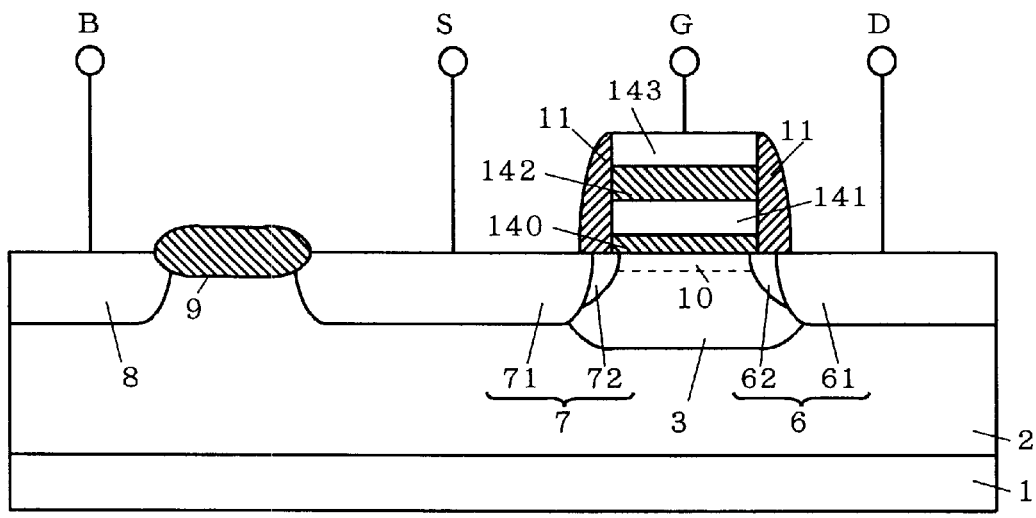
FIG. 51 is a schematic view showing an example of a section of a main part of an insulated gate transistor according to a fourteenth embodiment.

FIG. 51 is a schematic view showing a section of a main part of an insulated gate transistor according to a fourteenth embodiment of the present invention. In FIG. 51, the reference numeral 140 denotes a first gate insulation film made of a silicon oxide film, for example, the reference numeral 141 denotes a first gate electrode formed on a silicon substrate 1 and made of a semiconductor material having the same conductivity type as that of each of a drain region 6 and a source region 7, the reference numeral 142 denotes a second gate insulation film formed on the first gate electrode 141 and including a ferroelectric, the reference numeral 143 denotes a second gate electrode formed on the second gate insulation film 142 and made of a semiconductor material having a conductivity type which is different from that of the first gate electrode 141, and the same reference numerals as those in FIG. 48 denote corresponding portions.

Figure 52:
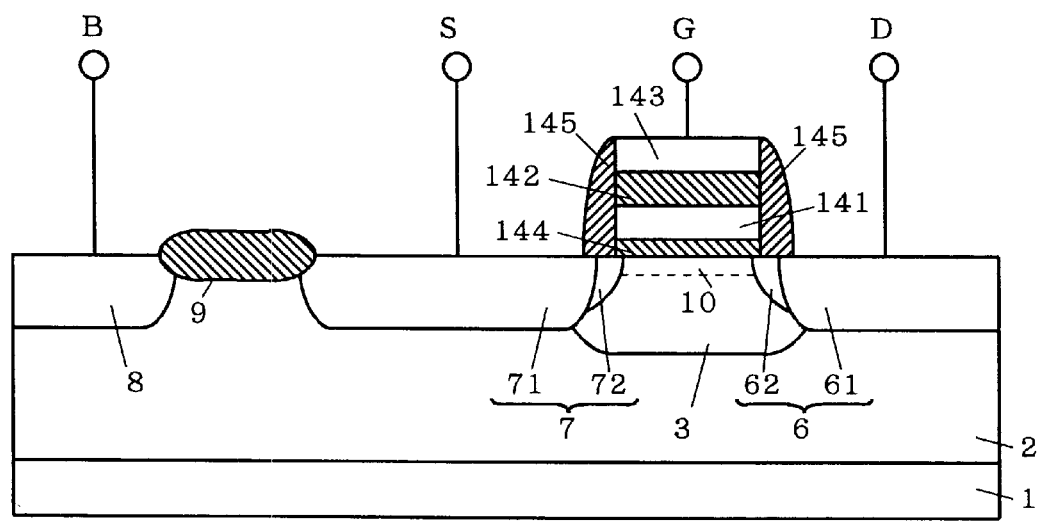
FIG. 52 is a schematic view showing another example of the section of the main part of the insulated gate transistor according to the fourteenth embodiment.

FIG. 52 is a schematic view showing a section of a main part of another insulated gate transistor according to the fourteenth embodiment of the present invention. In FIG. 52, the reference numeral 144 denotes a first gate insulation film including a ferroelectric, the reference numeral 145 denotes a sidewall including a ferroelectric, and the same reference numerals as those in FIG. 51 denote corresponding portions.

Figure 53:
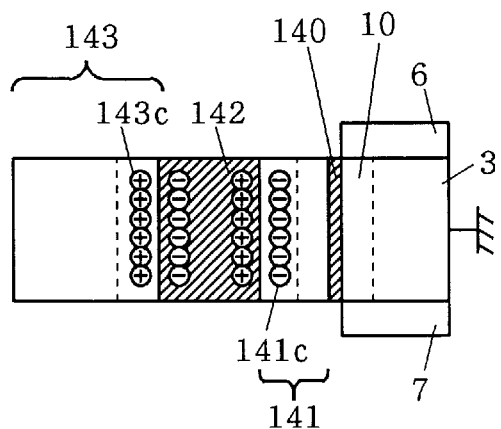
FIGS. 53 to 56 are conceptual views for explaining operation of the insulated gate transistor shown in FIG. 51.
Figure 54:
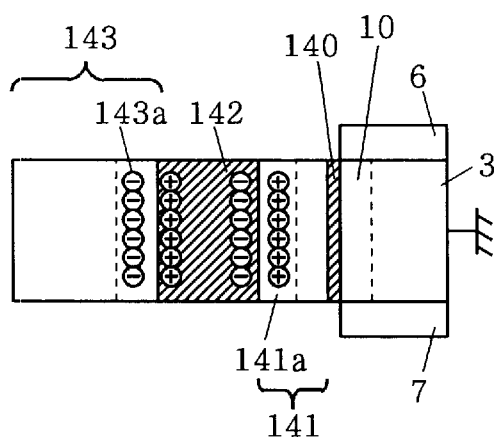
Figure 55:
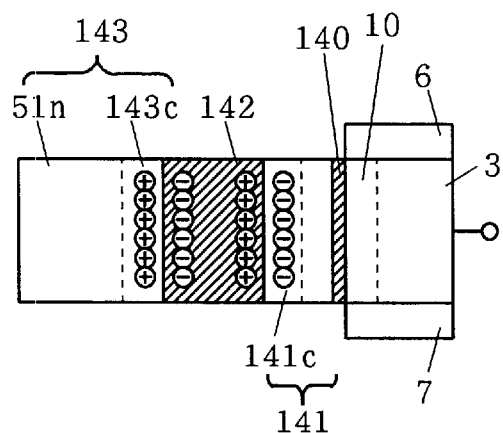
Figure 56:
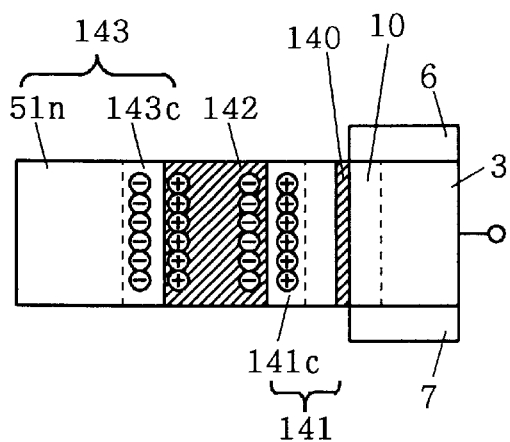

Since a second gate insulation film 142 includes a ferroelectric, it spontaneously polarizes according to an electric field generated therein. FIGS. 53 to 56 show a state of spontaneous polarization of the transistor shown in FIG. 51. FIGS. 53 and 54 are conceptual views for explaining operation of an N-channel transistor, and FIGS. 55 and 56 are conceptual views for explaining operation of a P-channel transistor. FIG. 53 shows a state in which a voltage of 0 V is applied to a silicon substrate 1 and a positive voltage is applied to a second gate electrode 143. At this time, the second gate insulation film 142 spontaneously polarizes so that a positive charge is generated in a portion of the second gate insulation film 142 which is close to a first gate electrode 141 and a negative charge is generated in a portion of the second gate insulation film 142 which is close to the second gate electrode 143. For this reason, a depletion layer is not generated on the second gate electrode 143 formed of a P type semiconductor. Similarly, the depletion layer is not generated in a portion of the first gate electrode 141 formed of an N type semiconductor which is provided in the vicinity of the second gate insulation film 142. Also in the case where a voltage of the second gate electrode 143 is then inverted, the same effects are obtained. In this case, the transistor according to the fourteenth embodiment generates the depletion layer with more difficulty than the transistor according to the thirteenth embodiment which has the same structure except for the second gate insulation film 142. In this case, the depletion layer is generated with difficulty in the transistor according to the fourteenth embodiment because the second gate insulation film 142 spontaneously polarizes. In the transistor according to the fourteenth embodiment, therefore, a threshold voltage can be reduced more than in the transistor according to the thirteenth embodiment.

FIG. 54 shows a state in which a voltage of 0 V or a negative voltage is applied to the second gate electrode 143. At this time, the second gate insulation film 142 spontaneously polarizes so that a positive charge is generated in a portion of the second gate insulation film 142 which is close to the second gate electrode 143 and a negative charge is generated in a portion of the second gate insulation film 142 which is close to the first gate electrode 141. Since the second gate electrode 143 is formed of the P type semiconductor, a depletion layer 143a is generated in a region of the second gate electrode 143 which is provided in contact with the second gate insulation film 142. Furthermore, since the first gate electrode 141 is formed of the N type semiconductor, a depletion layer 141a is generated in a region of the first gate electrode 141 which is provided in contact with the second gate insulation film 142. When the transistor is brought from an ON state into an OFF state, the depletion layers 141a and 143a disappear with a higher voltage than in the case where the second gate insulation film 142 does not spontaneously polarize. Consequently, a high threshold voltage can be obtained. Also in case of floating, the depletion layer might be formed. In that case, an OFF-state leak current can be reduced.

FIG. 55 shows a state in which a positive voltage is applied to the silicon substrate 1 and a voltage of 0 V or a negative voltage is applied to the second gate electrode 143. At this time, the second gate insulation film 142 spontaneously polarizes so that a negative charge is generated in a portion of the second gate insulation film 142 which is close to the second gate electrode 143 and a positive charge is generated in a portion of the second gate insulation film 142 which is close to the first gate electrode 141. Since the second gate electrode 143 is formed of the N type semiconductor, a depletion layer 143c is generated in a region of the second gate electrode 143 which is provided in contact with the second gate insulation film 142. Furthermore, since the first gate electrode 141 is formed of the P type semiconductor, a depletion layer 141c is generated in a region of the first gate electrode 141 which is provided in contact with the second gate insulation film 142.

FIG. 56 shows a state in which a positive voltage is applied to the silicon substrate 1 and a positive voltage is applied to the second gate electrode 143. At this time, the second gate insulation film 142 spontaneously polarizes so that a negative charge is generated in a portion of the second gate insulation film 142 which is close to the first gate electrode 141 and a positive charge is generated in a portion of the second gate insulation film 142 which is close to the second gate electrode 143. For this reason, the depletion layer is not generated on the second gate electrode 143 formed of the N type semiconductor. Similarly, the depletion layer is not generated on the first gate electrode 141 formed of the P type semiconductor.

The transistors shown in FIGS. 55 and 56 also have the same effects as those of the transistors shown in FIGS. 53 and 54.

The transistor shown in FIG. 52 has effects obtained by using the ferroelectric material for the first gate insulation film 144 and the sidewall 145, that is, the same effects as described with reference to FIG. 19 in addition to the effects obtained by the transistor shown in FIG. 51.

Fifteenth Embodiment

Figure 57:
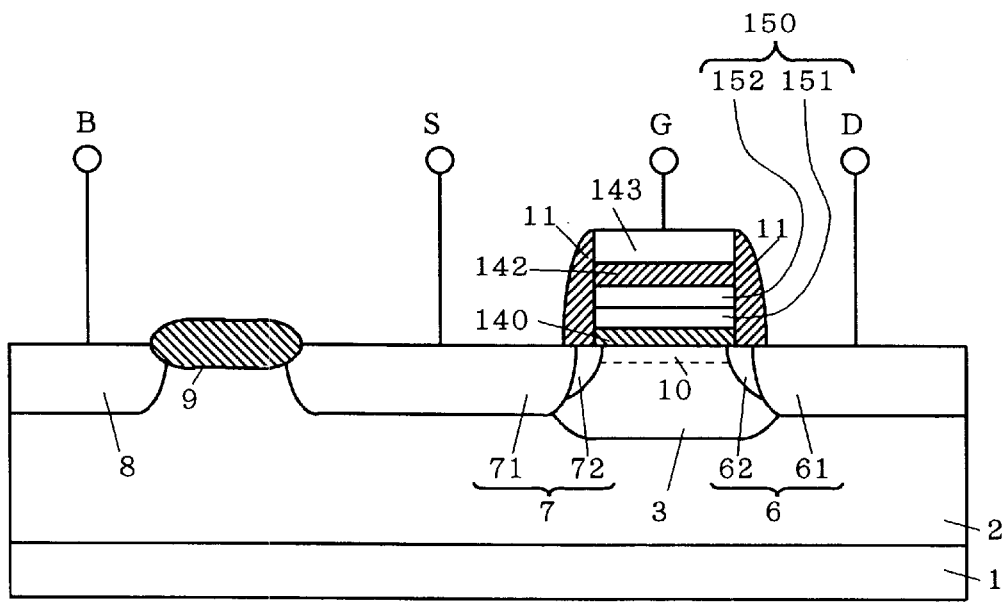
FIG. 57 is a schematic view showing an example of a section of a main part of an insulated gate transistor according to a fifteenth embodiment.

FIG. 57 is a schematic view showing a section of a main part of a structure of an insulated gate transistor according to a fifteenth embodiment of the present invention. In FIG. 57, the reference numeral 150 denotes a first gate electrode including first and second semiconductor regions 151 and 152 whose conductivity types are different from each other, and the same reference numerals as those in FIG. 51 denote corresponding portions.

In an N-channel transistor, a side close to a second gate insulation film 142 is set to an N type. In a P-channel transistor, the side close to the second gate insulation film 142 is set to a P type. Consequently, a region 152 close to the second gate insulation film 142 is depleted when the transistor is turned off, and a depletion layer of a region 151 close to a first gate insulation film 140 disappears when the transistor is turned on. Therefore, the same effects as those in the fourteenth embodiment can be obtained.

Sixteenth Embodiment

Figure 58:
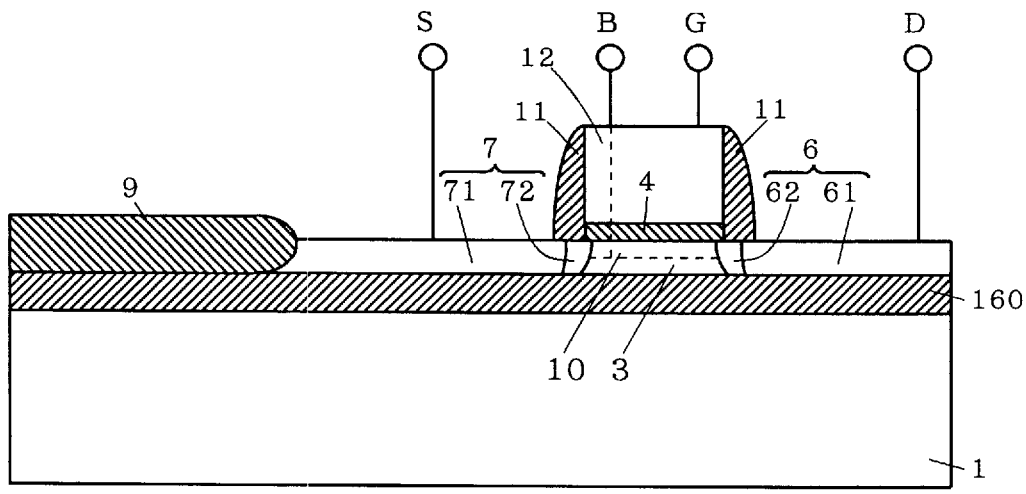
FIG. 58 is a schematic view showing an example of a section of a main part of an insulated gate transistor according to a sixteenth embodiment.

FIG. 58 is a schematic view showing a section of a main part of a structure of an insulated gate transistor according to a sixteenth embodiment of the present invention. In FIG. 58, the reference numeral 160 denotes a SOI isolation film formed on a silicon substrate 1, and the same reference numerals as those in FIG. 1 denote corresponding portions. A channel dope region 3, a drain region 6 and a source region 7 are formed on the SOI isolation film 160 differently from the insulated gate transistor shown in FIG. 1. An isolation film 9 is joined to the SOI isolation film 160. In this case, a back gate voltage is directly applied to the channel dope region 3 by using a terminal B.

In the transistor formed on the SOI isolation film 160 shown in FIG. 58, if the channel dope region 3 is insulated from the silicon substrate 1, the silicon substrate 1 has no voltage drop so that a voltage is correspondingly increased. Thus, depletion of a gate electrode 12 has more effects without a channel formed, which is desirable.

Figure 59:
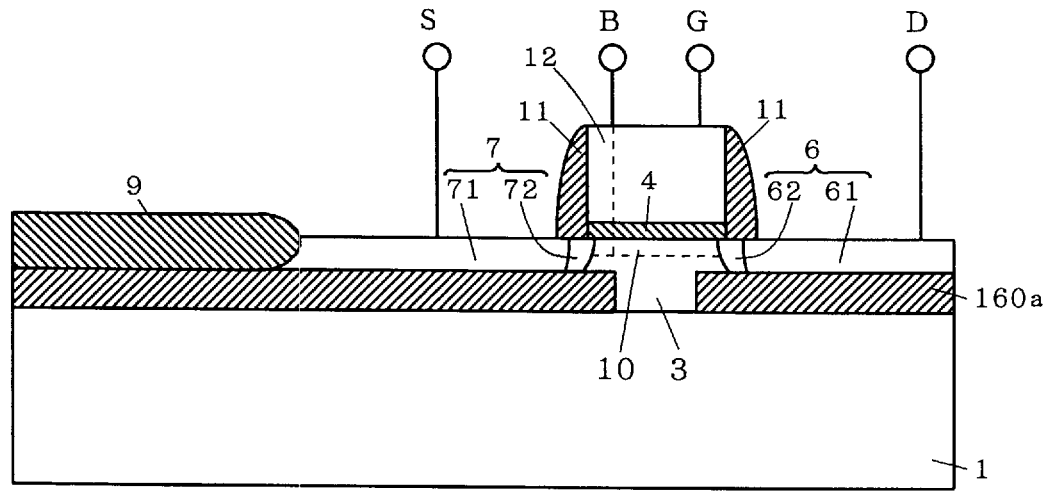
FIG. 59 is a schematic view showing another example of the section of the main part of the insulated gate transistor according to the sixteenth embodiment.

Even if a part of the channel dope region 3 is connected to the silicon substrate 1 as shown in FIG. 59, the same effects as described above can be obtained when a voltage is directly applied to the channel dope region 3 so that the voltage of the channel dope region 3 is increased.

Figure 60:
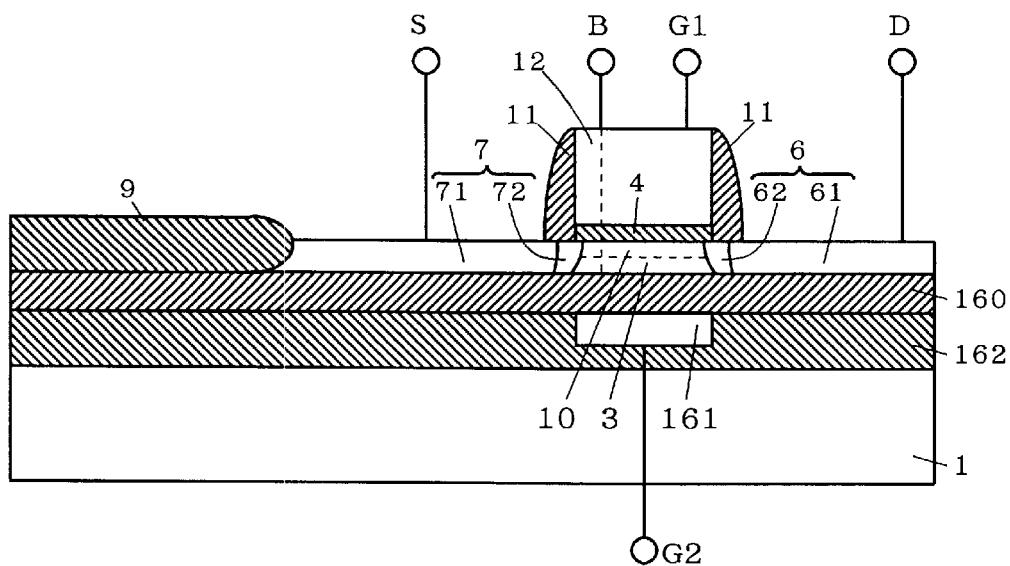
FIG. 60 is a schematic view showing yet another example of the section of the main part of the insulated gate transistor according to the sixteenth embodiment.

Even if a back gate electrode 161 for controlling a channel 10 is provided on the side of the SOI isolation film 160 which is opposite to the channel dope region 3 as shown in FIG. 60, the same effects as described above can be obtained. The back gate electrode 161 is also insulated from the silicon substrate 1 through an insulation film 162.

Figure 61:
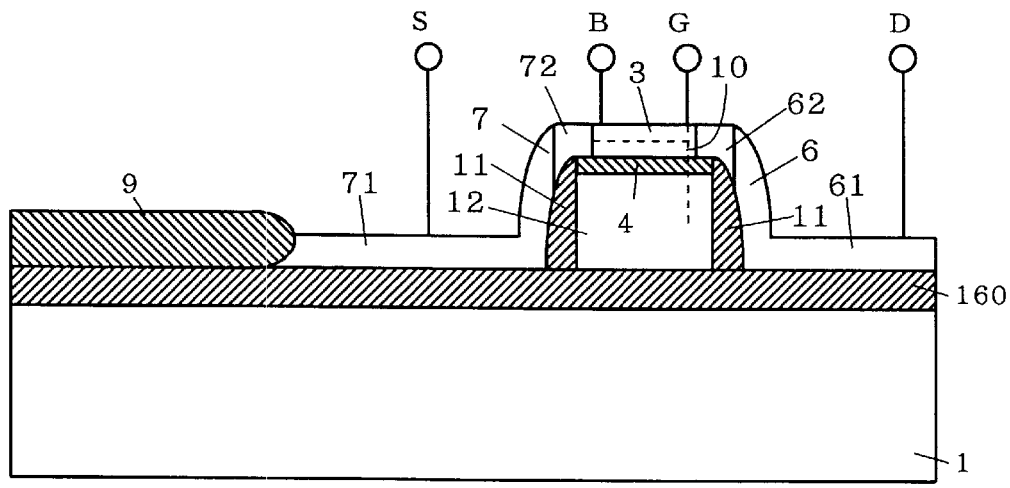
FIGS. 61 to 65 are schematic views showing further examples of the section of the main part of the insulated gate transistor according to the sixteenth embodiment.

Also in a thin film transistor in which a gate electrode 12 is formed on the SOI isolation film 160, a gate insulation film 4 is formed on the gate electrode 12 and a sidewall 11 is formed on their sides, and a channel dope region 3, a drain region 6 and a source region 7 are formed on the SOI isolation film 160, the sidewall 11 and the gate insulation film 4 as shown in FIG. 61, the same effects can be obtained.

Figure 62:
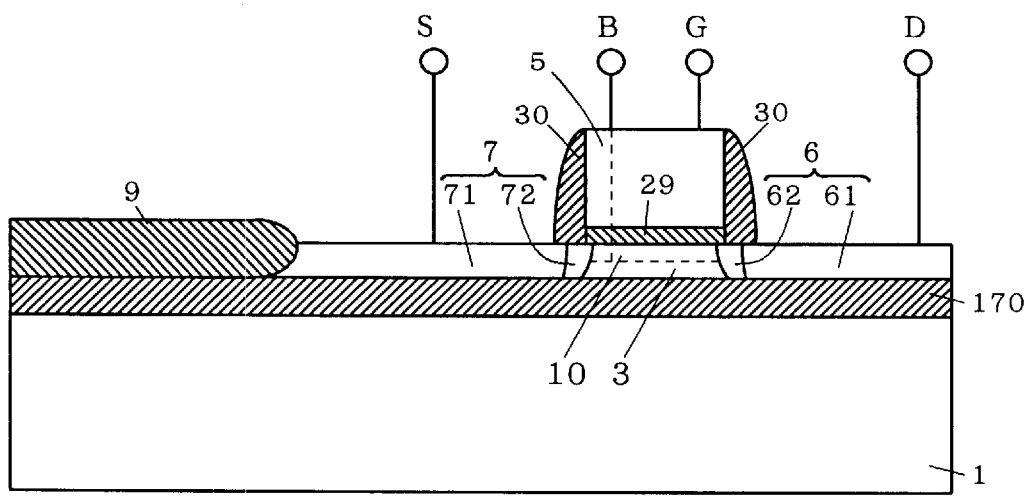
Figure 63:
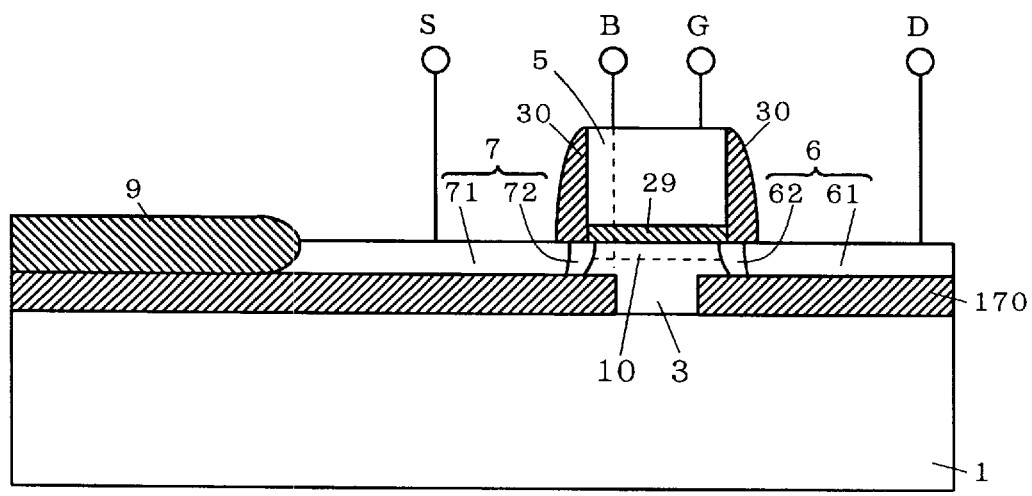
Figure 64:
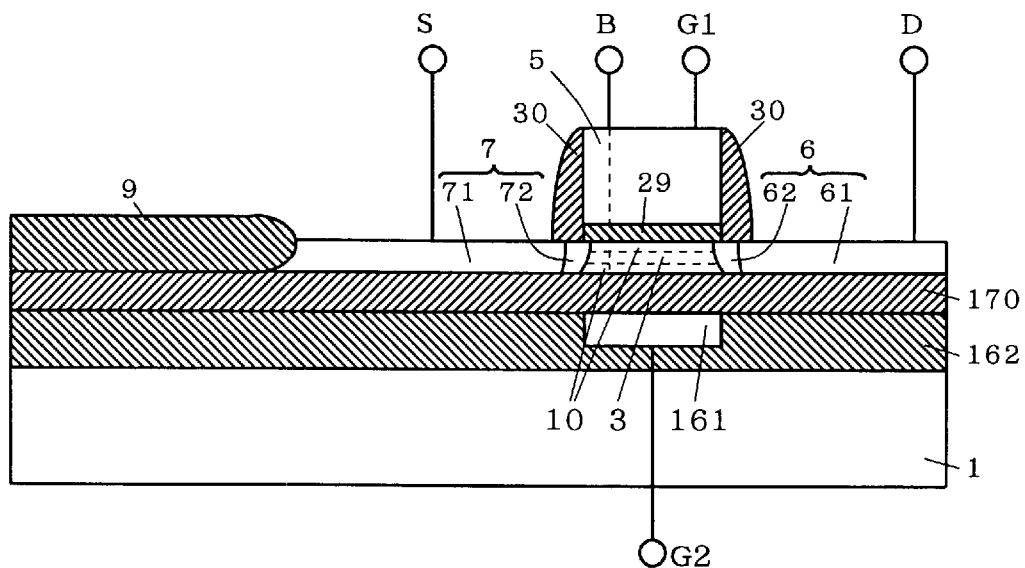
Figure 65:
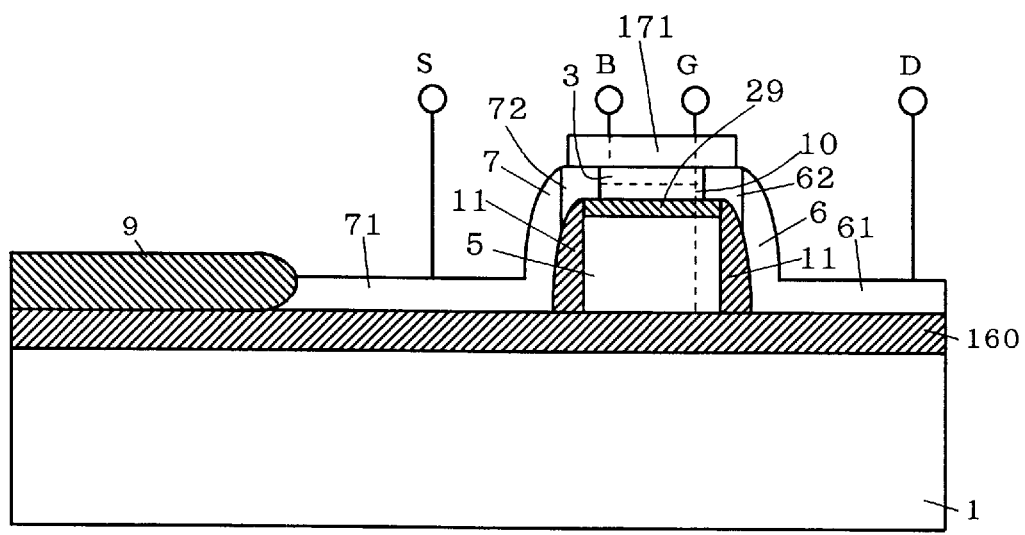

Also in the insulated gate transistor comprising the gate insulation film 15 including the ferroelectric described in the fifth embodiment, a channel dope region 3 can be formed on a SOI isolation film 170 as shown in FIGS. 62 to 64. In the case where a gate electrode 25 is formed on a SOI isolation film 160 as shown in FIG. 65, a channel dope region 3 can be formed under an interlayer dielectric film 171. The SOI isolation film 160 and the interlayer dielectric film 171 include a ferroelectric. By using a film including a ferroelectric material, it is possible to enhance characteristics of a low threshold voltage and high current driving force which are obtained in an ON state and characteristics of a high threshold voltage and a low subthreshold leak current which are obtained in an OFF state.

Seventeenth Embodiment

Figure 66:
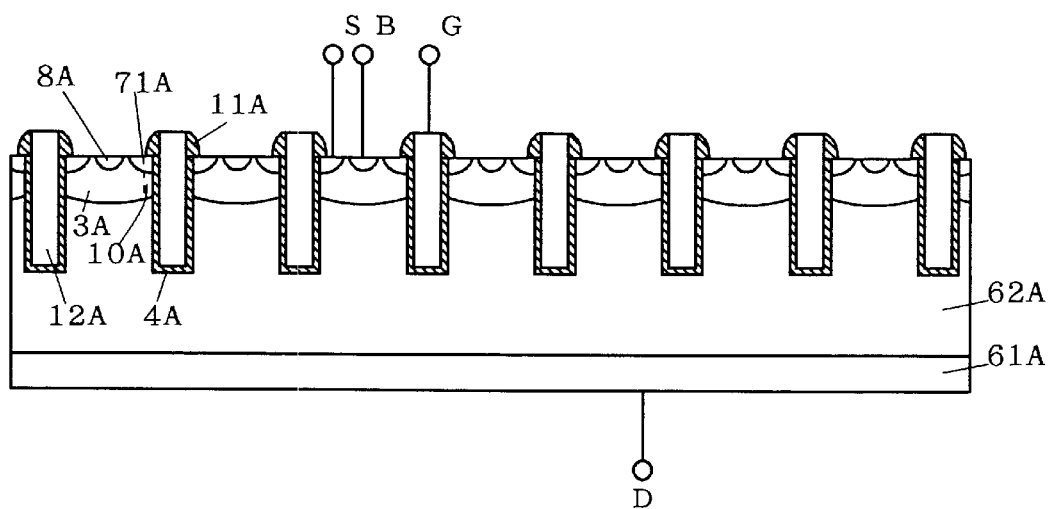
FIG. 66 is a schematic view showing an example of a section of a main part of an insulated gate transistor according to a seventeenth embodiment.
Figure 78:
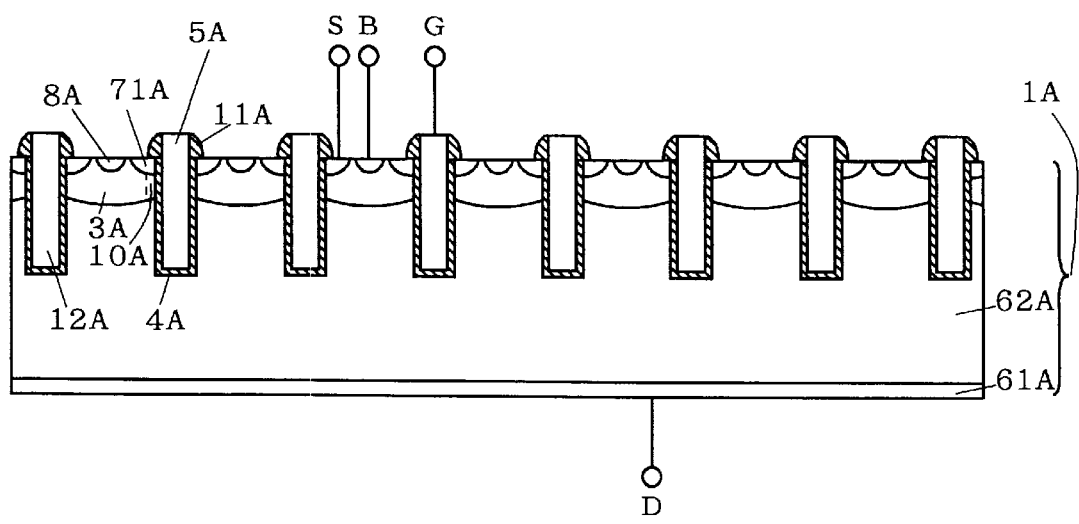
FIG. 78 is a schematic view showing an example of a section of a main part of a vertical type power MOS transistor according to the prior art.
Figure 79:
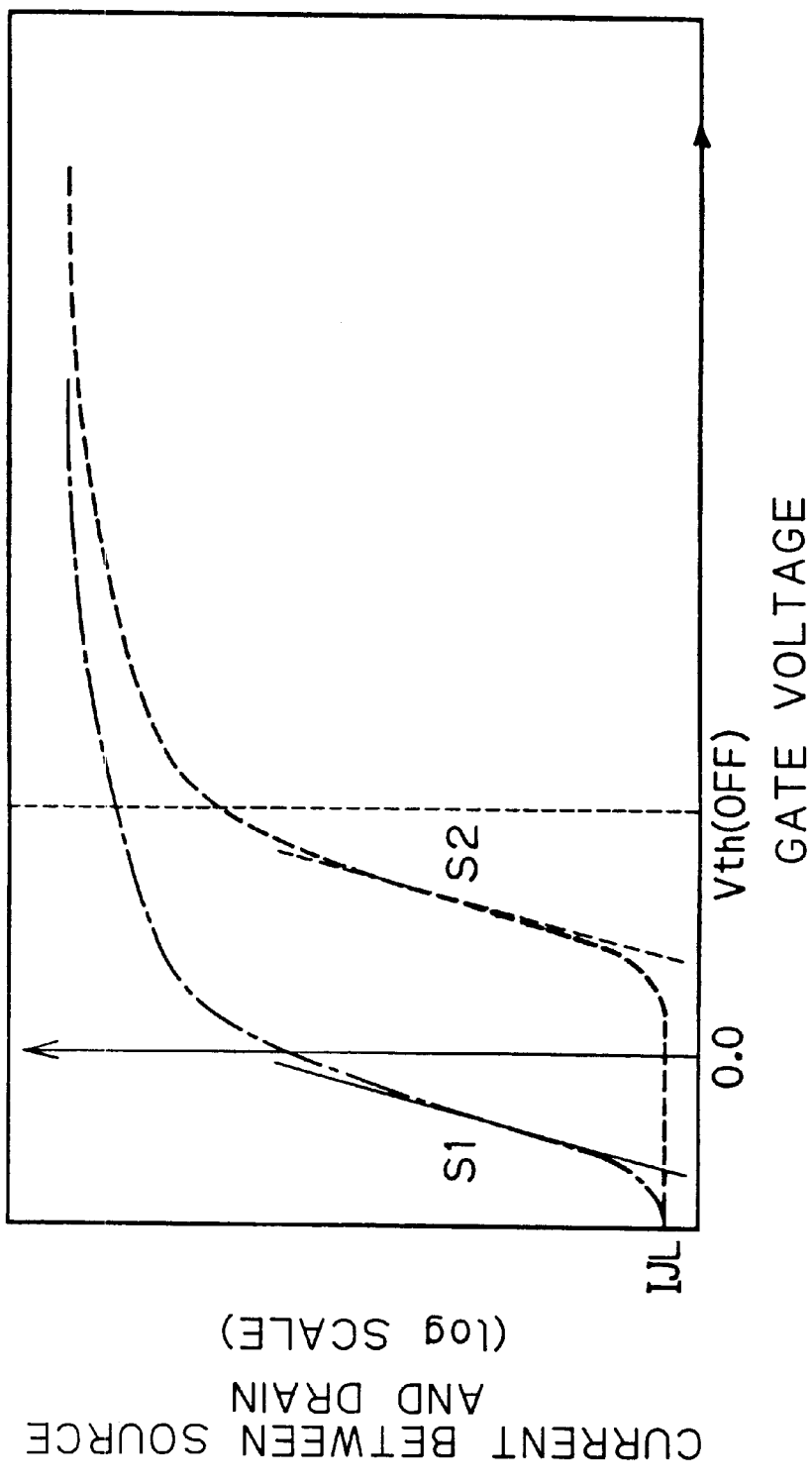
FIG. 79 is a graph showing a relationship between a gate voltage and a source-drain current of the MOS transistor in FIG. 75 or 78.
Figure 80:
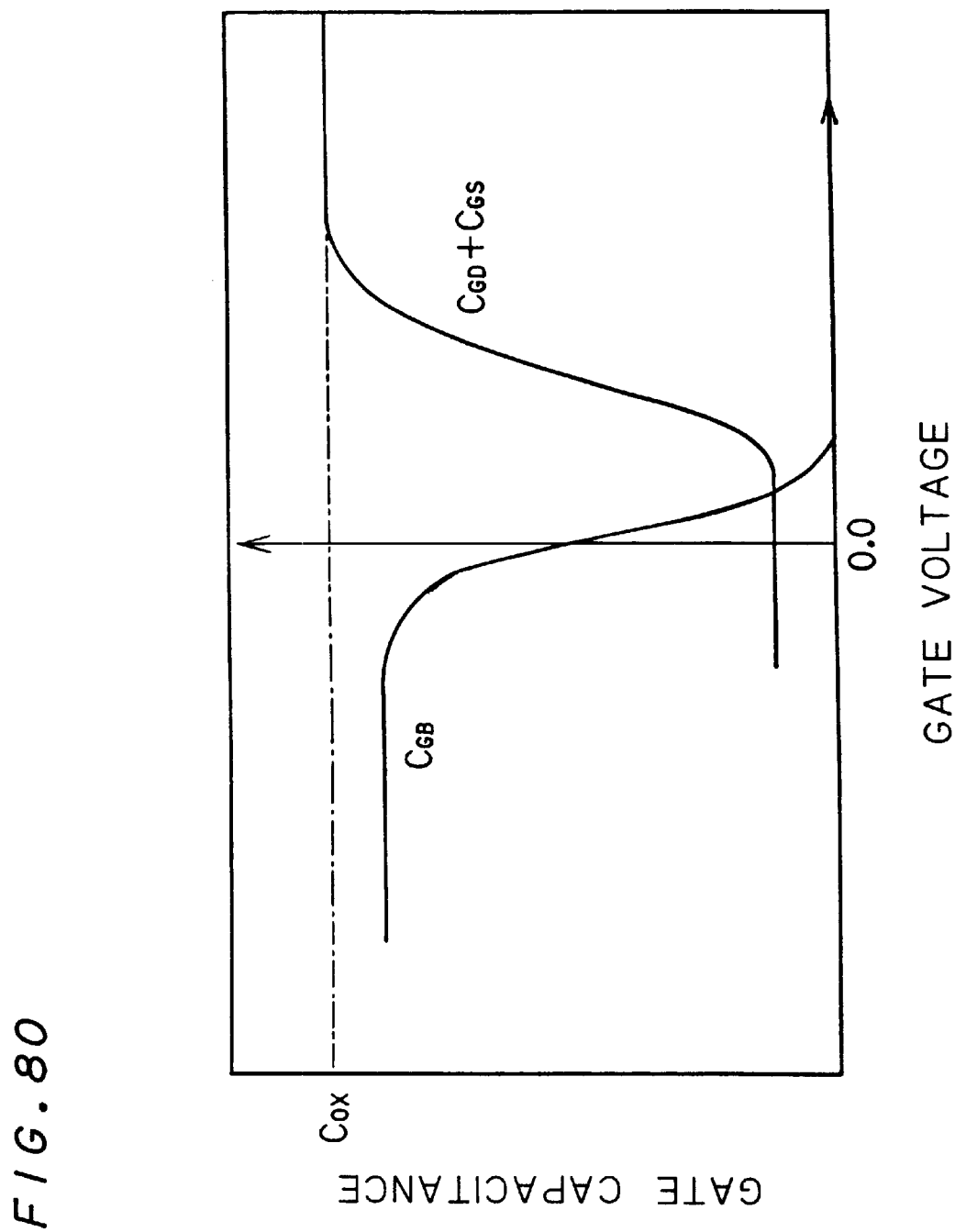
FIG. 80 is a graph showing a relationship between the gate voltage and a gate capacitance of the MOS transistor in FIG. 75 or 78.

FIG. 66 is a schematic view showing a section of a main part of a structure of an insulated gate transistor according to a seventeenth embodiment of the present invention. FIG. 66 shows a power MOS transistor having a vertical type structure suitable for operation with a high voltage. In the structure shown in FIG. 66, a gate electrode 12A made of polycrystalline silicon doped with an impurity having a low concentration is important to the present invention for the vertical type power MOS transistor according to the prior art shown in FIG. 78, and the same reference numerals as those in FIG. 78 denote corresponding portions. By using the gate electrode 12A, an effective gate insulation film thickness is increased by a depletion layer generated on the gate electrode 12A when the transistor is in an OFF state, and the depletion layer is not generated on the gate electrode 12A when the transistor is in an ON state. Therefore, an electric field is generated from the gate electrode 12A to a region 10A through only a gate insulation film 4A so that the same effects as those in the first embodiment can be obtained. Furthermore, a gate capacitance can be reduced in the OFF state. In an element having a high breakdown voltage, consequently, an increase in the gate capacitance is amplified by a Miller effect due to a great voltage amplification factor so that a switching speed of the element is prevented from being decreased. Thus, the element can operate at a high speed.

Eighteenth Embodiment

Figure 67:
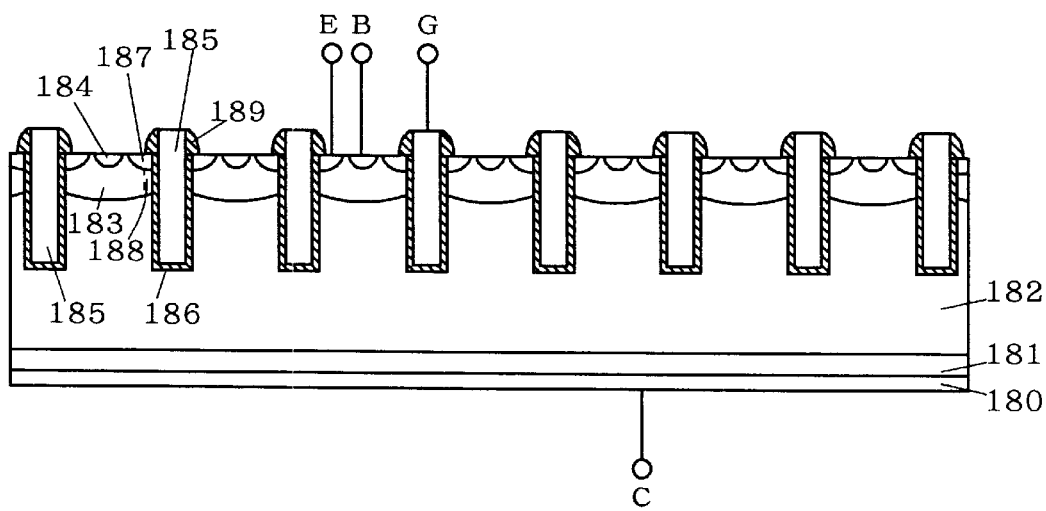
FIG. 67 is a schematic view showing an example of a section of a main part of an insulated gate transistor according to an eighteenth embodiment.

FIG. 67 is a schematic view showing a section of a main part of a structure of an insulated gate bipolar transistor (IGBT) according to an eighteenth embodiment of the present invention. In FIG. 67, the reference numeral 180 denotes a collector region formed of a P type semiconductor, the reference numeral 181 denotes a buffer region formed of an N type semiconductor in contact with the collector region 180, the reference numeral 182 denotes a semiconductor layer formed of the N type semiconductor having an impurity concentration which is lower than that of the buffer region 181, the reference numeral 183 denotes a well formed of the P type semiconductor, the reference numeral 184 denotes a P type semiconductor region having an impurity concentration which is higher than that of the well 183 for contact, the reference numeral 185 denotes a buried gate electrode formed in a trench which reaches from the well 183 to the semiconductor layer 182, the reference numeral 186 denotes a gate insulation film for insulating the gate electrode 185 from the semiconductor layer 182 and the well 183, the reference numeral 187 denotes an emitter region formed on the well 183 in contact with the gate insulation film 186, the reference numeral 188 denotes a channel generated on the well 183, and the reference numeral 189 denotes a sidewall formed on a side of the gate electrode 185.

In the same manner as the gate electrode 12A described in the seventeenth embodiment, the gate electrode 185 has a structure in which a depletion layer is generated on the gate electrode 185 if the transistor is in an OFF state, and the depletion layer is not generated on the gate electrode 185 if the transistor is in an ON state. A threshold voltage can be set by a thickness of the depletion layer without changing a thickness of the gate insulation film 186. According to the IGBT of the eighteenth embodiment, great current driving force can be kept when the threshold voltage is set high.

Nineteenth Embodiment

Figure 68:
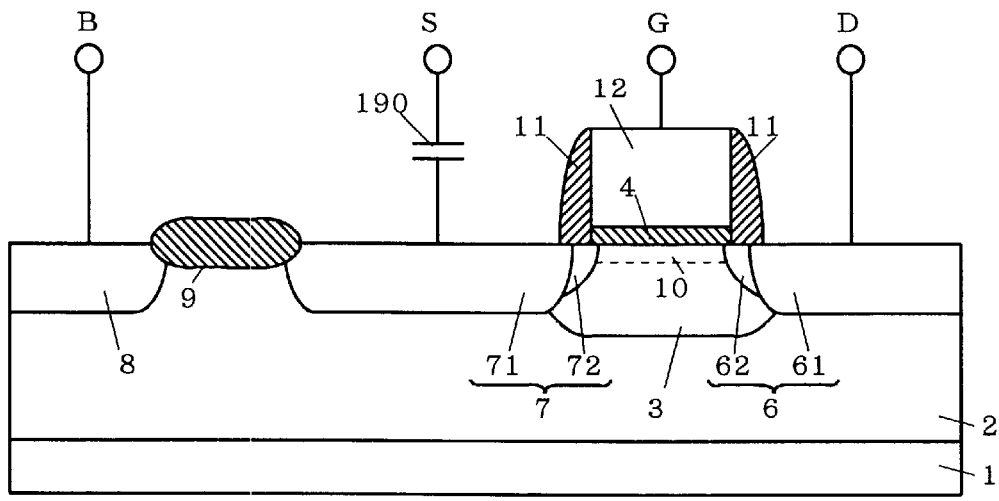
FIG. 68 is a schematic view showing an outline of a structure of a DRAM according to a nineteenth embodiment.

FIG. 68 is a conceptual view showing a state in which the transistor according to the first embodiment is used for a memory cell of a dynamic random access memory. In FIG. 68, the reference numeral 190 denotes a capacitor connected to a source region 7, and the same reference numerals as those in FIG. 1 denote corresponding portions. In the memory cell of the dynamic random access memory, it is important that a leak current should be small when a transistor forming the memory cell is in an OFF state and that a driving current should be great when the same transistor is in an ON state. Therefore, the transistor forming the memory cell of the dynamic random access memory described in the nineteenth embodiment is suitable for the transistors according to the first to fourth embodiments and the sixth to tenth embodiments.

Figure 69:
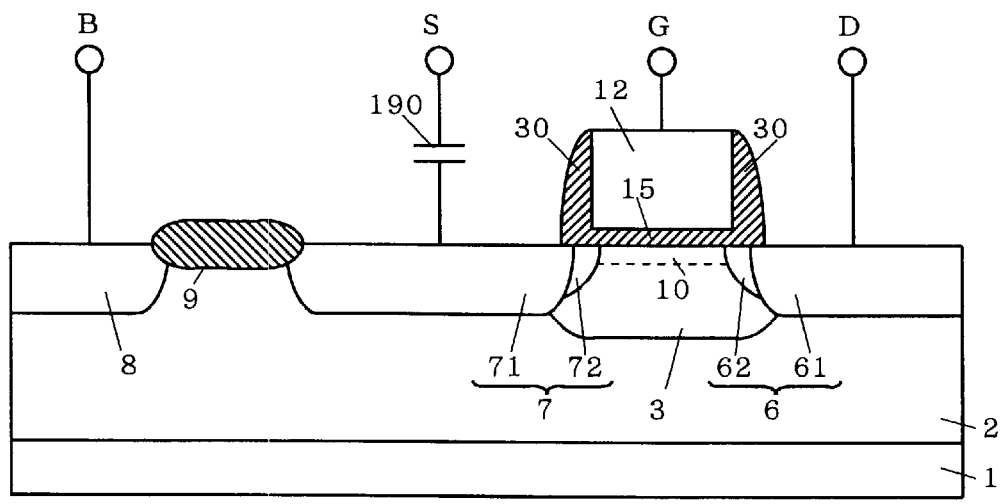
FIG. 69 is a schematic view showing an outline of another structure of the DRAM according to the nineteenth embodiment.

FIG. 69 shows a case where the transistor shown in FIG. 19 is applied to the dynamic random access memory.

Twentieth Embodiment

Figure 70:
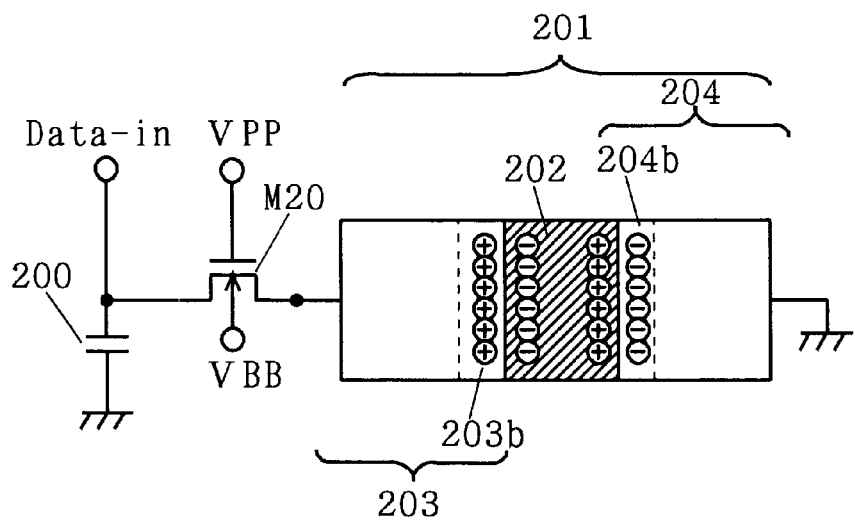
FIGS. 70 and 71 are conceptual views for explaining operation of a capacitor according to a twentieth embodiment.
Figure 71:
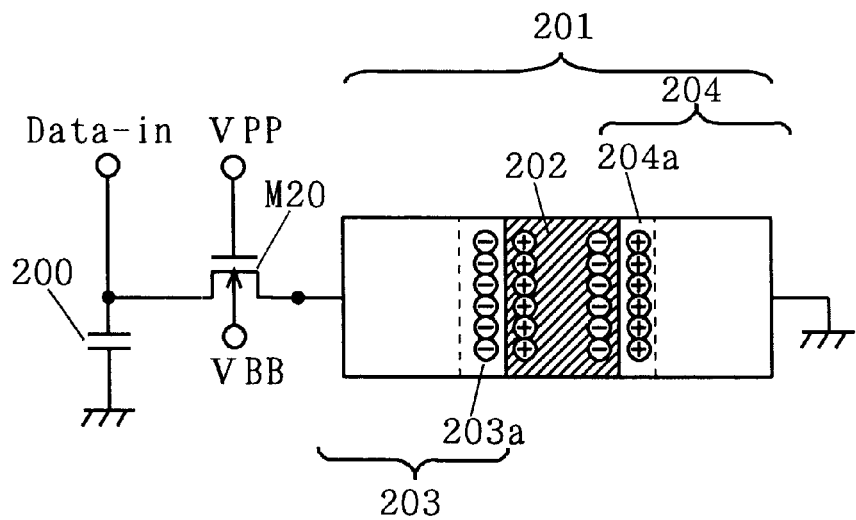

FIGS. 70 and 71 are conceptual views showing a structure of a memory cell of a dynamic random access memory. In FIGS. 70 and 71, the reference numeral M20 denotes an N-channel MOS transistor acting as a transfer gate transistor, the reference numeral 200 denotes a capacitance of a sense amplifier connected between one of current electrodes of the N-channel MOS transistor M20 and a ground potential point, and the reference numeral 201 denotes a capacitor connected between the other current electrode of the N-channel MOS transistor M20 and a ground potential point for storing information. A film including a ferroelectric is used for a dielectric layer of the capacitor 201. For this reason, when an electric field is applied to the same film, spontaneous polarization occurs. One of electrodes 203 of the capacitor 201 is formed of a P type semiconductor and is connected to the other current electrode of the N-channel MOS transistor M20. The other electrode 204 of the capacitor 201 is formed of an N type semiconductor and is grounded. In order not to form PN junction between the electrodes 203 and 204 and the current electrodes of the transistor M20, a suitable metal, a metal compound, or an electric conductor such as a semiconductor is interposed between the same electrodes.

A method for writing information if a positive voltage is applied to a source of the transistor is employed. As shown in FIG. 70, accumulation layers 203b and 204b are formed on both the electrodes 203 and 204 during writing. Therefore, a capacitance is increased so that a lot of charges can be accumulated. As shown in FIG. 71, the capacitance is reduced during reading so that a voltage is raised even if the same amount of charges are accumulated. Consequently, a refresh interval can be increased. A capacitance of a cell in which a voltage of a bit line or that of a word line is not at the High level is smaller than that of the cell in which both the voltages of the bit line and the word line are at the High level. Thus, a writing speed and reliability can be enhanced. Furthermore, depletion layers 203a and 204a are formed on the electrodes 203 and 204 during reading so that the capacitance is reduced more than in the case where the electrodes 203 and 204 are disconnected from the bit line by the transistor M20. Therefore, reading operation can be performed at a high speed.

While the ferroelectric has been used for a dielectric layer 202 of the capacitor 201 in the twentieth embodiment, the same kind of effects can be obtained if the ferroelectric is not used but an electrode to form a depletion layer is used. In addition, performance for storing information can be enhanced by spontaneous polarization of the dielectric layer 202.

Even if a conductivity type of the transfer gate transistor is varied or information is processed with electric potentials of counter electrodes of a capacitor and negative logic, the same effects can be obtained by properly selecting a conductivity type of a semiconductor forming electrodes.

While the invention has been described in detail, the foregoing description is in all aspects illustrative and not restrictive. It is understood that numerous other modifications and variations can be devised without departing from the scope of the invention.

I claim:

1. A semiconductor device, comprising:

a first gate electrode having a first plane provided opposite to a first semiconductor region where a channel is to be formed with a first gate insulation film interposed therebetween;

a second gate insulation film formed on a second plane of said first gate electrode which is provided opposite to said first plane; and a second gate electrode provided opposite to said first gate electrode through said second gate insulation film, wherein said second gate electrode has a second semiconductor region provided in contact with said second gate insulation film, a depletion layer extends to said second gate electrode from said second gate insulation film when a first voltage is applied, and a width of said depletion layer is smaller than in the case where said first voltage is applied or said depletion layer disappears when a second voltage is applied, and said second voltage causes more current to flow through said channel than said first voltage:

wherein an acceptor concentration Na, a donor concentration Nd, a permittivity $\in$ of said second gate electrode, a capacitance Cox of said second gate insulation film, an elementary charge q, a flat band voltage Vfb, and a voltage Vb applied to said first gate electrode satisfy the following equation:

$$Na-Nd \leq 8.53 \cdot Cox^2 \cdot (Vb-Vfb)/(q \cdot \in).$$

2. The semiconductor device according to claim 1, wherein said first gate insulation film includes a ferroelectric.

3. The semiconductor device according to claim 1, wherein said second semiconductor region of said second gate electrode has a conductivity type reverse to a conductivity type of a source region or a drain region provided in contact with said first semiconductor region, said first gate electrode has a third semiconductor region provided in contact with said first gate insulation film and a fourth semiconductor region provided in contact with said second gate insulation film, and each of said third and fourth semiconductor regions has the same conductivity type as said conductivity type of said source region or said drain region, and said third semiconductor region has higher impurity concentration than said fourth semiconductor region.

4. The semiconductor device according to claim 1, wherein said first gate electrode is formed of a semiconductor having a first conductivity type, said first gate electrode has a first impurity concentration in a portion close to said second gate insulation film and a second impurity concentration in a portion close to said first gate insulation film, said first impurity concentration is greater than said second impurity concentration if said first conductivity type is reverse to said second conductivity type, and said first impurity concentration is smaller them said second impurity concentration if said first conductivity type same as said second conductivity type.

5. The semiconductor device according to claim 1, wherein said second gate insulation film includes a ferroelectric.

* * * * *